(12) United States Patent
Lim

(10) Patent No.: US 9,362,422 B2
(45) Date of Patent: Jun. 7, 2016

(54) SEMICONDUCTOR DEVICE AND METHOD FOR FABRICATING THE SAME

(71) Applicant: Samsung Electronics Co., Ltd., Suwon-Si, Gyeonggi-Do (KR)

(72) Inventor: Han-jin Lim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/459,455

(22) Filed: Aug. 14, 2014

(65) Prior Publication Data

US 2015/0171159 A1  Jun. 18, 2015

(30) Foreign Application Priority Data

Dec. 12, 2013 (KR) ........................ 10-2013-0154809

(51) Int. Cl.
| | | |
|---|---|---|
| *H01L 29/94* | (2006.01) | |
| *H01L 29/41* | (2006.01) | |
| *H01L 29/92* | (2006.01) | |
| *H01L 27/108* | (2006.01) | |
| *H01L 49/02* | (2006.01) | |

(52) U.S. Cl.
CPC .......... *H01L 29/94* (2013.01); *H01L 27/10805* (2013.01); *H01L 27/10808* (2013.01); *H01L 27/10814* (2013.01); *H01L 27/10817* (2013.01); *H01L 27/10823* (2013.01); *H01L 27/10855* (2013.01); *H01L 28/91* (2013.01); *H01L 29/41* (2013.01); *H01L 29/92* (2013.01); *H01L 29/945* (2013.01)

(58) Field of Classification Search
CPC ......... H01L 28/60; H01L 28/82; H01L 29/41; H01L 29/92; H01L 29/94; H01L 29/945; H01L 27/108; H01L 27/10805; H01L 27/10808; H01L 27/10817
See application file for complete search history.

(56) References Cited

U.S. PATENT DOCUMENTS

| | | | |
|---|---|---|---|
| 7,034,350 B2 * | 4/2006 | Chung | H01L 28/91 257/296 |
| 8,134,823 B2 | 3/2012 | Chen et al. | |
| 8,288,224 B2 | 10/2012 | Huang et al. | |
| 8,441,100 B2 | 5/2013 | Lee et al. | |
| 8,471,305 B2 * | 6/2013 | Kim | 257/253 |
| 2010/0052098 A1 * | 3/2010 | Miyajima | 257/532 |
| 2011/0017971 A1 * | 1/2011 | Kim et al. | 257/5 |
| 2012/0138940 A1 * | 6/2012 | Sato | 257/59 |
| 2013/0228837 A1 * | 9/2013 | Sukekawa et al. | 257/296 |
| 2014/0327062 A1 * | 11/2014 | Park et al. | 257/296 |

FOREIGN PATENT DOCUMENTS

| | | |
|---|---|---|
| JP | 2008016688 A | 1/2008 |
| JP | 2008193088 A | 8/2008 |

(Continued)

*Primary Examiner* — Eduardo A Rodela
(74) *Attorney, Agent, or Firm* — Harness, Dickey & Pierce, P.L.C.

(57) ABSTRACT

Provided is a semiconductor device and a method for fabricating the same. The semiconductor device includes an interlayer insulating layer formed on a semiconductor substrate, a metal contact plug penetrating the interlayer insulating layer, a cylindrical lower electrode formed on the metal contact plug and including a first metal and a trench, a supporter formed in the trench and including a second metal that is different from the first metal, a dielectric layer formed on the lower electrode and the supporter and an upper electrode formed on the dielectric layer.

17 Claims, 30 Drawing Sheets

(56) References Cited

FOREIGN PATENT DOCUMENTS

| | | |
|---|---|---|
| JP | 2009054972 A | 3/2009 |
| KR | 20050073153 A | 7/2005 |
| KR | 100622284 B1 | 9/2006 |
| KR | 100865726 B1 | 10/2008 |
| KR | 100869342 B1 | 11/2008 |
| KR | 100889321 B1 | 3/2009 |
| KR | 20110001146 A | 1/2011 |

* cited by examiner

SEMICONDUCTOR DEVICE AND METHOD FOR FABRICATING THE SAME

CROSS-REFERENCE TO RELATED APPLICATIONS

This application claims priority from Korean Patent Application No. 10-2013-0154809, filed on Dec. 12, 2013, in the Korean Intellectual Property Office, the disclosure of which is incorporated herein in its entirety by reference.

BACKGROUND

1. Field of the Invention

The example embodiments relate to a semiconductor device and a method for fabricating the same.

2. Description of the Prior Art

Electrical characteristics of a capacitor in a memory device, such as a DRAM (Dynamic Random Access Memory), exert a great influence on the final yield characteristics of the product. The increase of the capacitance value causes the increase of the amount of charge that is stored in the capacitor. The increase of the charge amount can improve the refresh characteristics of the DRAM and satisfy the electrical characteristics of the semiconductor device.

On the other hand, in order to increase the capacitance, a technology to form the DRAM so that the DRAM includes a stack type lower electrode has been developed. As the height of a stack type storage structure becomes higher, the cell capacitance typically increases. However, a gap between cells is narrowed, and an aspect ratio between a lower length and a height of the capacitor structure is typically increases. Accordingly, due to the thermal and mechanical stresses exerted on the electrode of the capacitor, a difference in strain between the surface and the interior of the electrode typically occurs. Due to such a difference in strain, the stack capacitor may deteriorate.

SUMMARY

At least one example embodiment includes a semiconductor device that can improve reliability.

At least one example embodiment includes a method for fabricating a semiconductor device having improved reliability.

Additional example embodiments will be set forth in part in the description which follows and in part will become apparent to those having ordinary skill in the art upon examination of the following.

According to at least one example embodiment, a semiconductor device includes an interlayer insulating layer on a semiconductor substrate, a metal contact plug in at least a portion of the interlayer insulating layer, a lower electrode on the metal contact plug, the lower electrode including a trench, and a supporter in the trench, the supporter being more ductile than the lower electrode. The semiconductor device may further include a dielectric layer on the lower electrode and the supporter and an upper electrode on the dielectric layer, and the lower electrode and the upper electrode may form a capacitor.

BRIEF DESCRIPTION OF THE DRAWINGS

The above and other example features of an example inventive concept will be more apparent from the following detailed description taken in conjunction with the accompanying drawings, in which.

DETAILED DESCRIPTION

Figure 1:
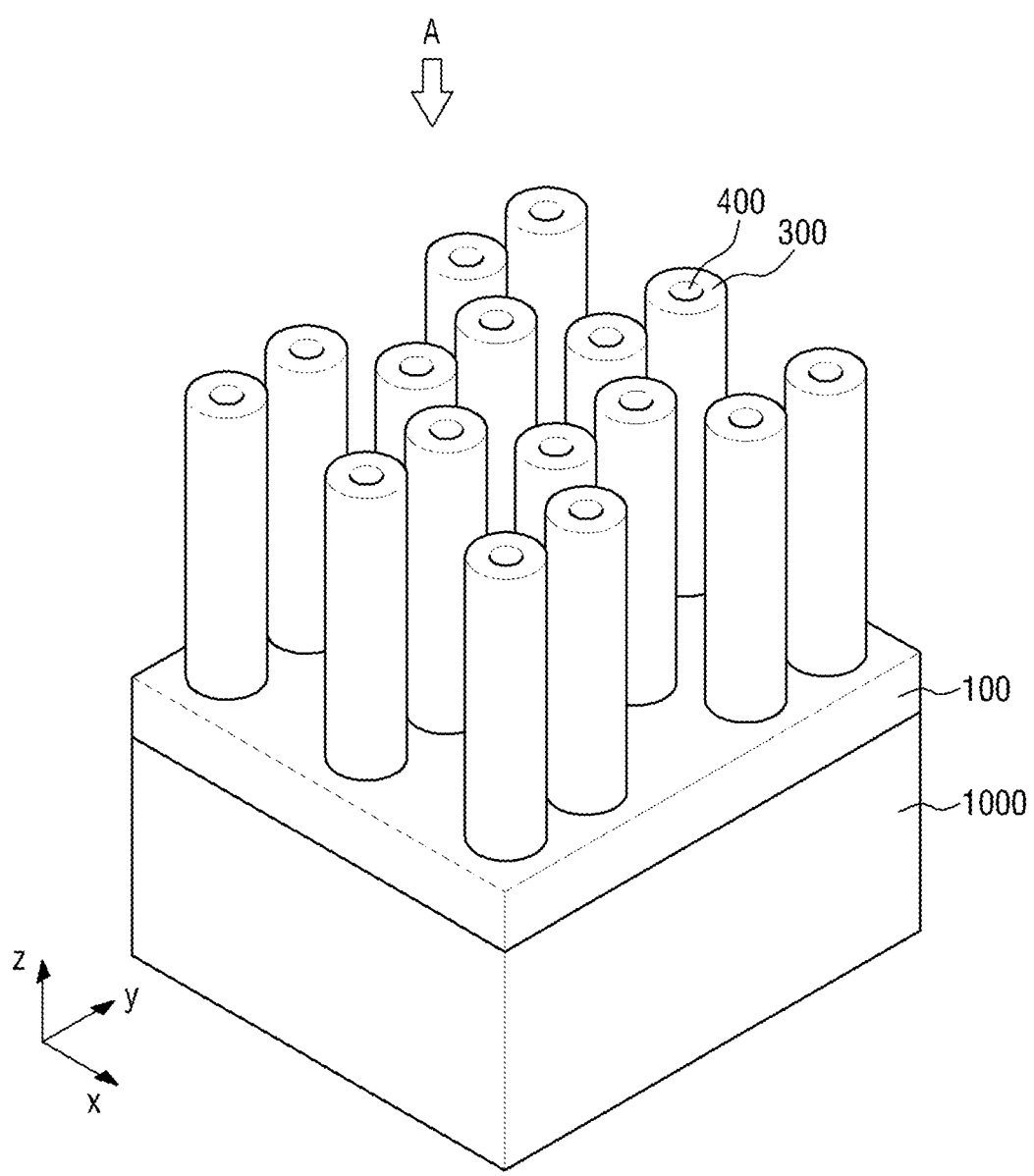
FIG. 1 is a partial perspective view explaining a semiconductor device according to an example embodiment.

Example embodiments may be understood more readily by reference to the following detailed description and the accompanying drawings. An example inventive concept may, however, be embodied in many different forms and should not be construed as being limited to the example embodiments set forth herein. Rather, these example embodiments are provided so that this disclosure is thorough and complete and fully conveys the inventive concept to those skilled in the art. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same or a similar meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

In the drawing figures, the dimensions of layers and regions may be exaggerated for clarity of illustration. The same reference numbers indicate the same components throughout the specification.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

Referring to FIGS. 1 to 5, a semiconductor device according to an example embodiment concept will be described.

Figure 2:
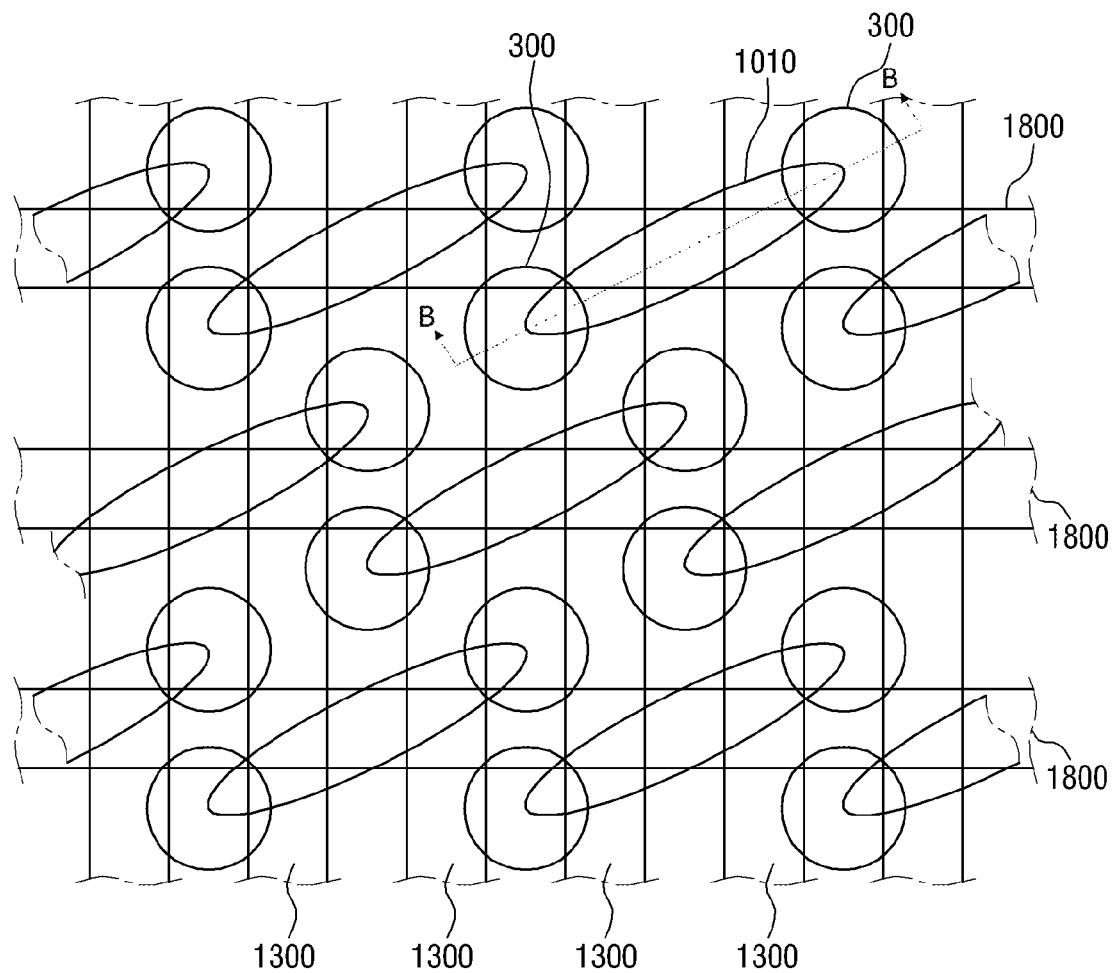
FIG. 2 is a layout diagram as seen in a direction A of FIG. 1.
Figure 3A:
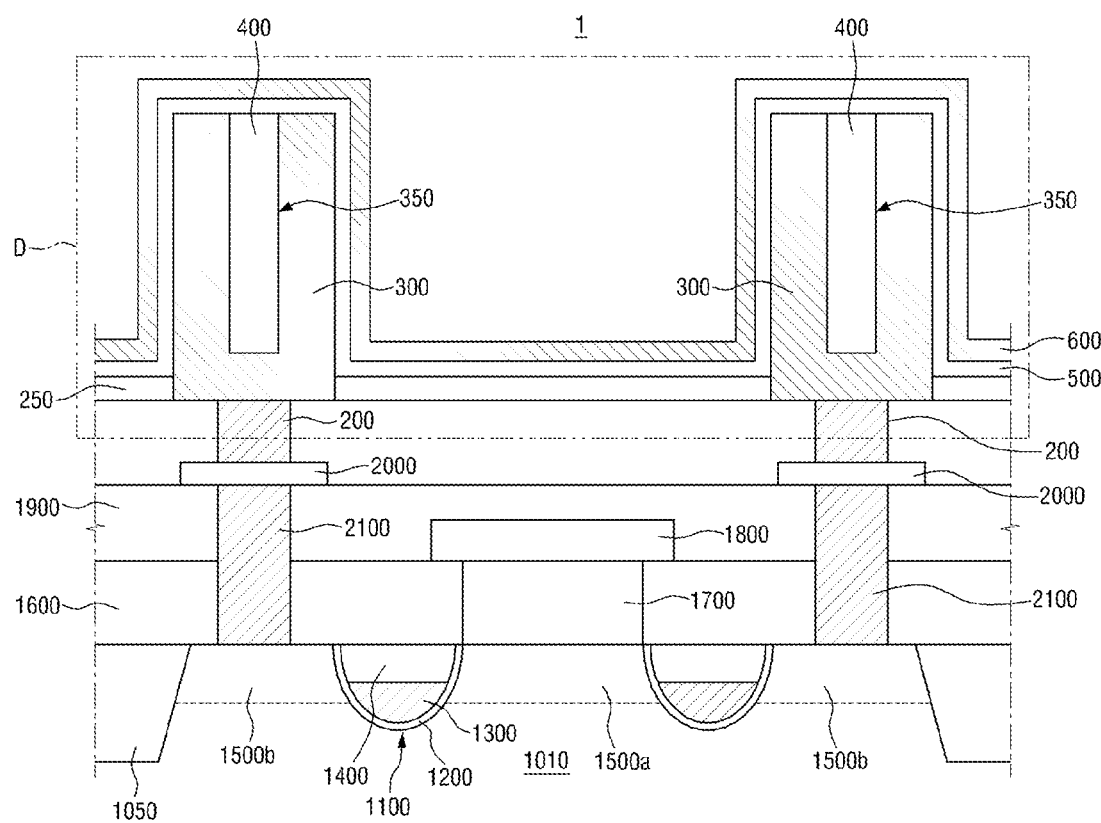
FIG. 3A is a cross-sectional view taken along line B-B of FIG. 2.
Figure 3B:
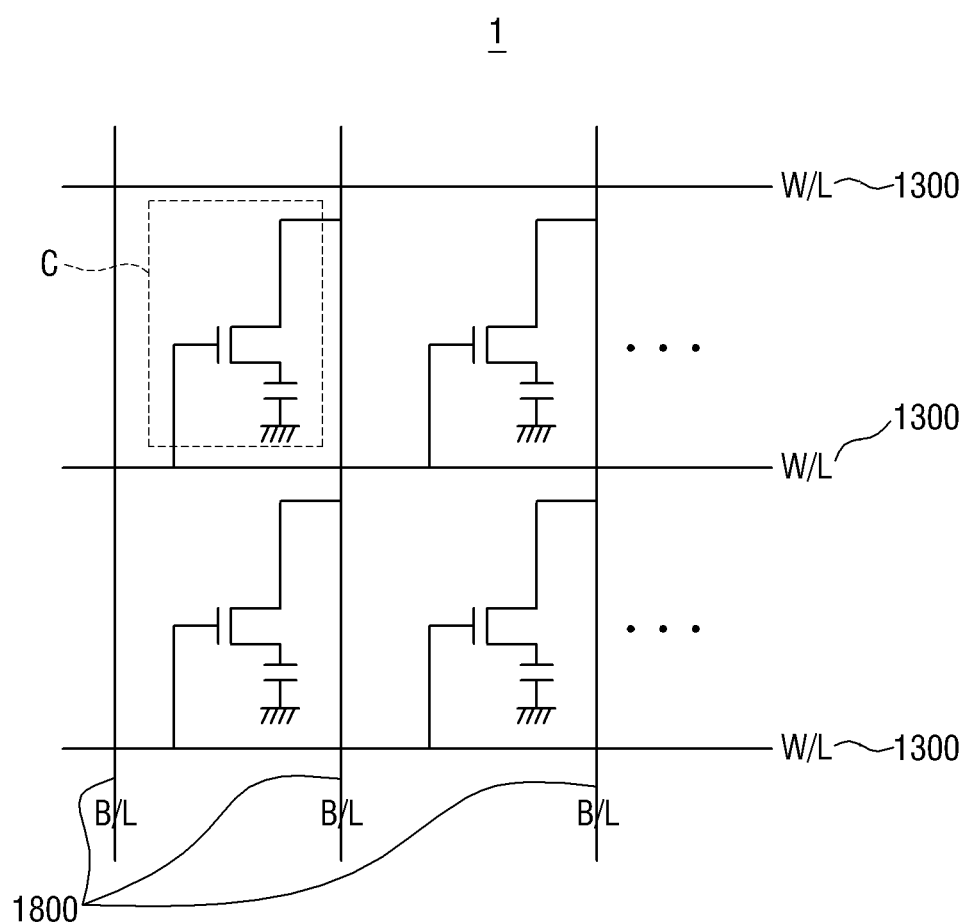
FIG. 3B is a circuit diagram explaining a semiconductor device according to an example embodiment.
Figure 4:
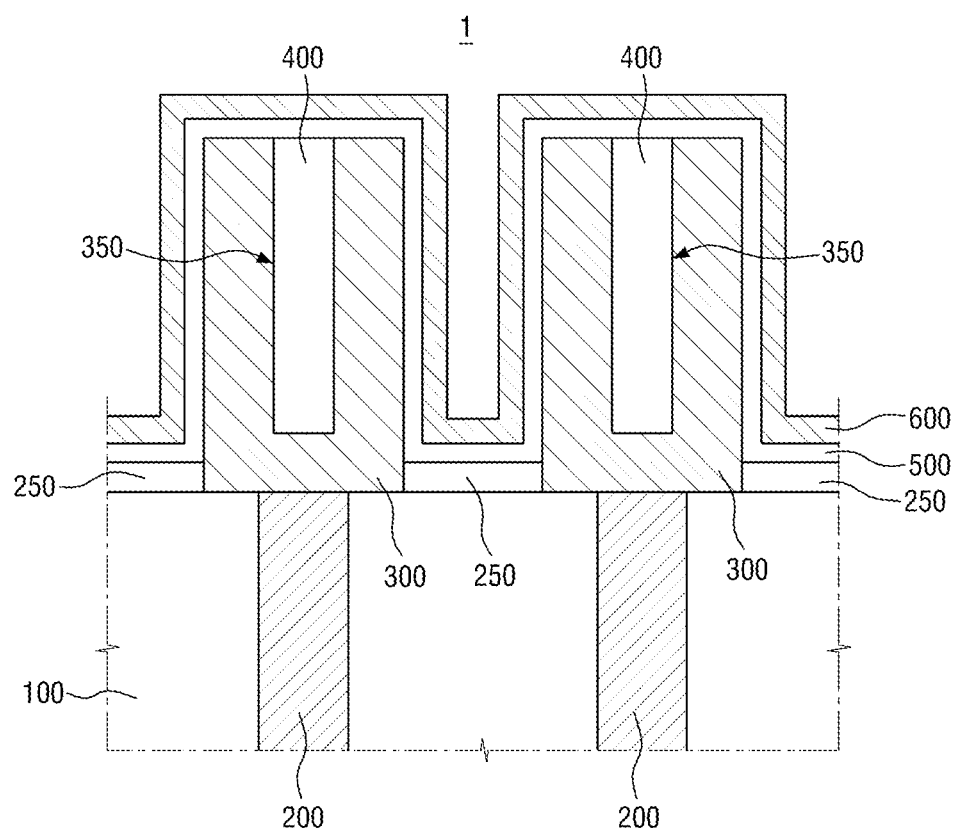
FIG. 4 is an enlarged cross-sectional view of a portion D of FIG. 3A.
Figure 5:
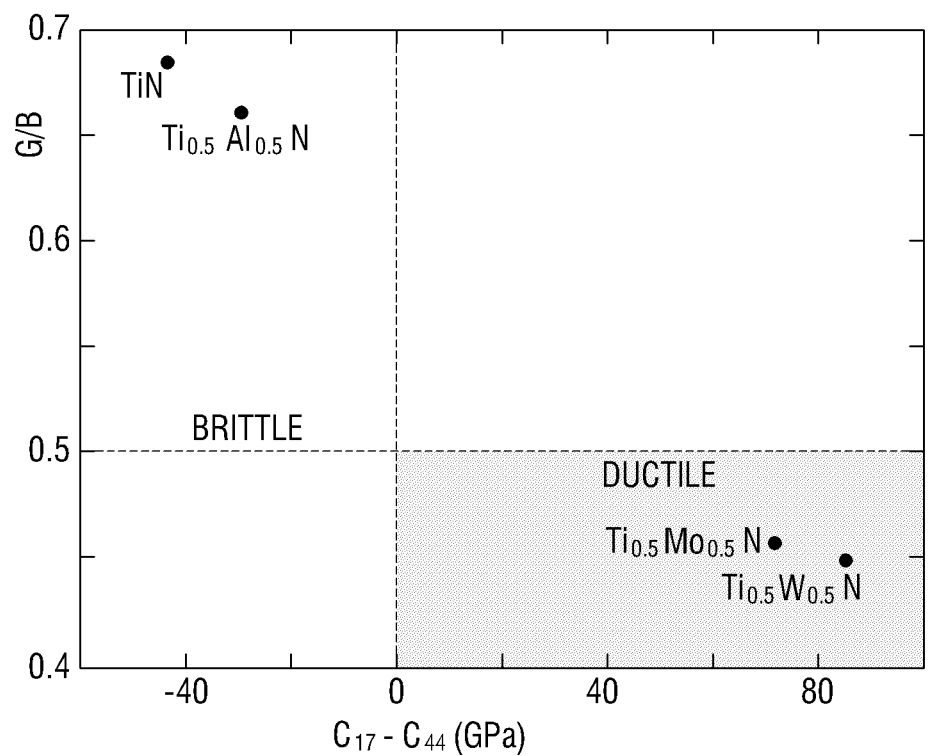
FIG. 5 is a graph showing comparison results of ductility between materials that form a first lower electrode and a first supporter of FIG. 4.

FIG. 1 is a partial perspective view explaining a semiconductor device according to an example embodiment, and FIG. 2 is a layout diagram as seen in a direction A of FIG. 1. FIG. 3A is a cross-sectional view taken along line B-B of FIG. 2, and FIG. 3B is a circuit diagram explaining a semiconductor device according to an example embodiment. FIG. 4 is an enlarged cross-sectional view of a portion D of FIG. 3A, and FIG. 5 is a graph showing comparison results of ductility between materials that form a first lower electrode and a first supporter of FIG. 4.

Referring to FIGS. 1 to 5, a semiconductor device 1 according to a first embodiment of an example embodiment includes a substrate 1000, an interlayer insulating layer 100, a first metal contact plug 200, an etch stop layer 250, a first lower electrode 300, a first trench 350, a first supporter 400, a dielectric layer 500, and an upper electrode 600.

A MIM capacitor is a capacitor having a metal-insulator-metal structure, and a MIM capacitor according to an example embodiment may be particularly used as a capacitor that stores information of a DRAM device.

According to at least one example embodiment, the substrate 1000 may be divided into an isolation region 1050 and an active region 1010. The active region 1010 is defined by forming the isolation region 1050 in the substrate 1000. For example, referring to FIG. 2, the active region 1010 is formed to extend in a first direction DR1, a gate electrode (i.e., word line) 1300 is formed to extend in an X direction that forms an acute angle with the first direction DR1, and a bit line 1800 is formed to extend in a Y direction that forms an acute angle with the first direction DR1. At both ends of the active region 1010, a cylindrical lower electrode 300 may be formed.

According to at least one example embodiment, the angle in the expression "a specific direction and another specific direction form a predetermined angle" means a lower angle of two angles that are formed through crossing of two directions. For example, if angles that may be formed through crossing of two directions are 120° and 60°, the angle is 60°. Accordingly, as illustrated in FIG. 2, the angle that is formed by the first direction DR1 and the X direction is $\theta_1$, and the angle that is formed by the first direction DR1 and the Y direction is $\theta_2$. As described above, the reason why $\theta_1$ and/or $\theta_2$ form an acute angle is to optimally secure a gap between a bit line contact 1700 connecting the active region 1010 and the bit line 1800, and a contact plug 2100 connecting the active region 1010 and a storage element. $\theta_1$ and $\theta_2$ may be, for example, 45° and 45°, 30° and 60°, or 60° and 30°, but are not limited thereto.

According to at least one example embodiment, the substrate 1000 may be a rigid substrate, such as a silicon substrate, a SOI (Silicon On Insulator) substrate, a gallium arsenide substrate, a silicon germanium substrate, a ceramic substrate, a quartz substrate, or a glass substrate for display, or a flexible plastic substrate that is made of polyimide, polyester, polycarbonate, polyethersulfone, polymethylmethacrylate, polyethylenenaphthalate, or polyethyleneterephthalate.

Referring to FIG. 3A, a buried trench 1100 may be formed in the active region 1010, and a gate insulating layer 1200, the gate electrode 1300, and a capping pattern 1400 may be formed, e.g. in this order, in the buried trench 1100. A first source/drain region 1500a and a second source/drain region 1500b may be formed on both side surfaces of the buried trench 1100. The gate electrode 1300, the first source/drain region 1500a, and the second source/drain region 1500b may operate as a BCAT (Buried Channel Array Transistor).

A first insulating layer 1600 may be formed on the BCAT, and the bit line contact 1700, in contact with the bit line 1800, may be formed so as to penetrate the first insulating layer 1600. A second insulating layer 1900 may be formed to cover the bit line 1800, and a contact plug 2100, connected to a landing pad 2000, may be formed to penetrate the second insulating layer 1900.

Referring to FIG. 4, the interlayer insulating layer 100 may be formed on the substrate 1000. Specifically, the interlayer insulating layer 100 may be formed on the second insulating layer 1900 and the landing pad 2000. The interlayer insulating layer 100 may include, for example, silicon oxide, such as BSG (BoroSilicate Glass), PSG (PhosphoSilicate Glass), BPSG (BoroPhosphoSilicate Glass), USG (Undoped Silicate Glass), TEOS (TetraEthylOrthoSilicate Glass), or HDP-CVD (High Density Plasma-CVD).

The first metal contact plug 200 may be formed to penetrate the interlayer insulating layer 100. The first metal contact plug 200 may electrically connect elements provided between the interlayer insulating layers 100. The first metal contact plug 200 may include metal, for example, tungsten (W), but is not limited thereto. For example, the first metal contact plug may include Co, Ni, Cu, Ru, Pd, Ag, Pt, Au, In, Sn, CoW, CoWP or NiB.

The etch stop layer 250 may be positioned on a side surface of the first lower electrode 300 on the interlayer insulating layer 100. The etch stop layer 250 may be formed of a material having an inferior etch rate as the etch rate of the first lower electrode 300, and may serve as an end point layer in an etching process. In this example embodiment, the etch stop layer 250 may include, for example, SiON or SiN. As needed, forming of the etch stop layer 250 may be omitted.

The first lower electrode 300 may be formed on the first metal contact plug 200. The first lower electrode 300 may be in a cylindrical shape. The first lower electrode 300 may be a capacitor together with the upper electrode 600 and the dielectric layer 500. The first lower electrode 300 may be made of, or include, a first conductive material. For example, the first conductive material may be TiN, TaN, W, Ru, or Pt, but is not limited thereto.

Referring to FIG. 1, the first lower electrodes 300 may be in a stack shape extending in a vertical Z direction. A plurality of first lower electrodes 300 may be aligned in a horizontal X direction perpendicular to the Z direction and in a horizontal Y direction perpendicular to the X direction and to the Z direction. The first supporter 400 may be inside the first lower electrode 300. Thereafter, the dielectric layer 500 and the upper electrode 600 may be formed on the first lower electrode 300 and the first supporter 400. Referring to FIG. 2, the first lower electrode 300 may be formed at both ends of the active region 1010.

The first trench 350 may be formed inside of first lower electrode 300. Specifically, due to the existence of the first trench 350, the first lower electrode 300 may be in a cylindrical shape as a result. The first trench 350, formed on the first lower electrode 300, may protect the first conductive material that forms the first lower electrode 300 from deterioration. However, since the shape of the trench may be a weak point on the capacitor structure, the supporter 400 may be used to supplement the weak point.

The first supporter 400 may be formed inside the first trench 350. Specifically, the first supporter 400 may substantially completely fill the trench. The upper surface of the first supporter 400 may be formed on the same or similar plane as the upper surface of the first lower electrode 300. The term "same plane" may include a fine step height between the upper surface of the first supporter 400 and the upper surface of the first lower electrode 300.

FIG. 5 is a graph showing comparison results of ductility between materials that form a first lower electrode and a first supporter of FIG. 4.

Referring to FIG. 5, the first conductive material that forms the first lower electrode 300 of the semiconductor device 1, according to an example embodiment, may be a brittle material. The second conductive material that forms the first supporter 400 may be a ductile material.

Generally, if a value G/B obtained by dividing a shear modulus G of a specific material by an elastic bulk modulus B is equal to or larger than 0.57, it may be considered that the material is brittle. If the value G/B of the material is smaller than 0.57, it may be considered that the material is ductile. It may be considered that the brittle material has easy breaking characteristics relatively to the ductile material. In other words, it may be considered that the ductile material has plastically deformable characteristics relatively to the brittle material.

According to an example embodiment, the first supporter 400 including a ductile conductive material mitigates the stress of the first lower electrode 300 including a brittle first conductive material, and thus the first lower electrode 300 can be prevented from collapsing or from other physical deterioration.

Specifically, as the first lower electrode 300 of the semiconductor device 1, according to an example embodiment, a brittle material, such as TiN, may be used. Because the conductive material, such as TiN, may be brittle, if excessive stress is applied to the first lower electrode 300, the first lower electrode 300 may be broken, for example in the lateral direction (e.g., in the left/right direction in FIG. 4).

Accordingly, if the first supporter 400 including a ductile material is not provided between the first lower electrodes 300, the first lower electrode 300 may be damaged due to the stress to deteriorate the reliability of the semiconductor device 1.

However, according to the semiconductor device 1 according to an example embodiment, the first supporter 400 including the ductile conductive material is arranged between portions of the first lower electrodes 300 as shown in FIG. 4.

Since the first supporter 400 having the ductile characteristics performs a cushioning function, the first supporter 400 can help mitigate lateral stress that is applied to the first lower electrode.

Referring to FIG. 5, the first lower electrode 300 may include, for example, TiN or $Ti_{0.5}Al_{0.5}N$, which is brittle. Accordingly, the first supporter 400 that corresponds to the first lower electrode 300 may include $Ti_{0.5}W_{0.5}N$ or $Ti_{0.5}Mo_{0.5}N$, which is ductile.

However, the example embodiments are not limited to that as exemplified above. For example, in some other example embodiments, the second conductive material that forms the first supporter 400 may be a material having an ultimate tensile strength (UTS) that is higher than the UTS of the first conductive material that forms the first lower electrode 300.

In this case, since the first supporter 400 is formed of a material having a tensile strength that is much higher than the tensile strength of the first lower electrode 300, the first lower electrode 300 can be prevented from collapsing. Specifically, the tensile stress that is applied to the first lower electrode 300 can be supported by the first supporter 400 provided therein. Accordingly, the first lower electrode 300 may be prevented from collapsing. The second conductive material may be, for example, carbon nanotube or graphene.

Since carbon nanotubes or graphene are materials having a UTS of 63 Gpa or more, carbon nanotubes or graphene have a much greater UTS than the material that forms the first lower electrode 300, for example, TiN.

Referring again to FIG. 4, the dielectric layer 500 may cover the first lower electrode 300, the first supporter 400, and the etch stop layer 250. The dielectric layer 500 may prevent charge from transferring between the first lower electrode 300 and the upper electrode 600. The charge is unable to pass through the dielectric layer 500, but the dielectric layer 500 can be charged by a voltage difference between the first lower electrode 300 and the upper electrode 600. The dielectric layer 500 may include, for example, $Al_2O_3$, $HfO_2$, lanthanum oxide, $ZrO_2$, $Ta_2O_5$, $TiO_2$, $SrTiO_3$, $BaSrTiO_3$, or a combination thereof, but is not limited thereto.

The upper electrode 600 may be formed on the dielectric layer 500. The upper electrode 600 may form a capacitor together with the dielectric layer 500 and the first lower electrode 300. That is, the upper electrode 600 may gather positive charge together with the first lower electrode 300. The upper electrode 600 may include a material that is similar to the material of the first lower electrode 300. For example, the upper electrode 600 may include TiN, TaN, W, Ru, or Pt, but is not limited thereto.

Referring again to FIGS. 3A and 3B, the semiconductor device 1 according to at least one example embodiment may be expressed by a circuit diagram in which word lines 1300 and bit lines 1800 form a lattice structure. The semiconductor device 1 according to an example embodiment may be a DRAM device in which transistors and capacitors are positioned between lattices of the word lines 1300 and the bit lines 1800.

Specifically, the gate insulating layer 1200, the gate electrode 1300, and the capping pattern 1400, which are formed in the buried trench 1100, may serve as a gate of a transistor in a cell of a portion C in FIG. 3B. Since two gates are illustrated in FIG. 1, it can be known that FIG. 1 is a cross-sectional view of two cells. A first source/drain region 1500a and a second source/drain region 1500b, which are formed on both side surfaces of the buried trench 1100, may serve as the source or drain of the transistor of the portion C in FIG. 3B. The first lower electrode 300, the dielectric layer 500, and the upper electrode 600 may serve as the capacitor of the portion C.

Figure 6:
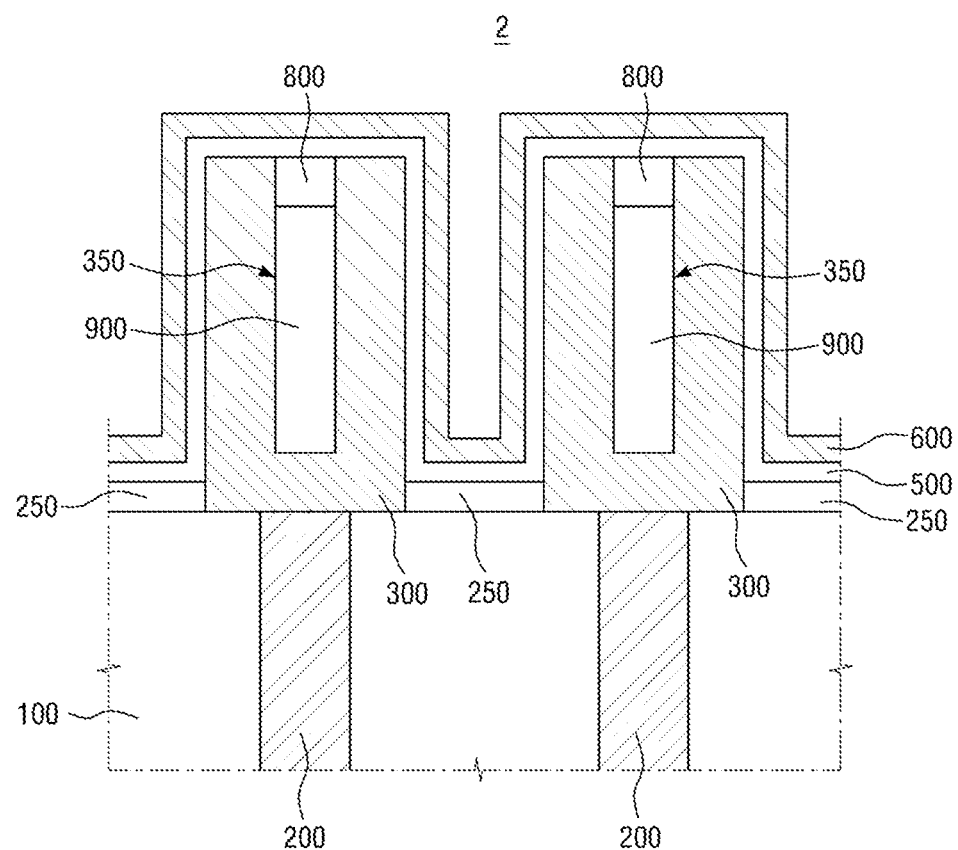
FIG. 6 is a cross-sectional view explaining a semiconductor device according to an example embodiment.

Referring to FIG. 6, a semiconductor device according to a second embodiment of an example inventive concept will be described.

FIG. 6 is a cross-sectional view explaining a semiconductor device according to another example embodiment. Hereinafter, explanation of the same or similar constituent elements as those according to the above-described example embodiment will be omitted and explanation will be made around different points between the embodiments.

Referring to FIG. 6, in a semiconductor device 2 according to an example embodiment, the shape of a second supporter 800 may be different from the shape of the first supporter 400 (in FIG. 4) of the semiconductor device 1 as described above.

Specifically, the second supporter 800 is formed to fill a portion of a first trench 350. The second supporter 800 may be formed on an upper portion of the first trench 350. Since the second supporter 800 is formed as described above, a first void 900 may be formed between the first lower electrodes 300 as illustrated in FIG. 6.

The first void 900 may be formed in the first trench 350. The first void 900 may be formed on a lower portion of the second supporter 800. The first void 900 may be an empty space in the first trench 350, and may mitigate stress of the first lower electrode 300.

Specifically, as the first lower electrode 300 becomes thicker, the tensile stress may be increased. For example, if the thickness of the lower electrode that includes TiN is about 500 Å or more, a lifting phenomenon may occur. The lifting phenomenon means that an outside of the first lower electrode 300 splits and comes off. In this example embodiment, since the first void 900 is formed inside the semiconductor device 2, the first lower electrode 300 becomes thin. Accordingly, the first void 900 mitigates the stress of the first lower electrode 300 to prevent the lifting phenomenon.

Figure 7:
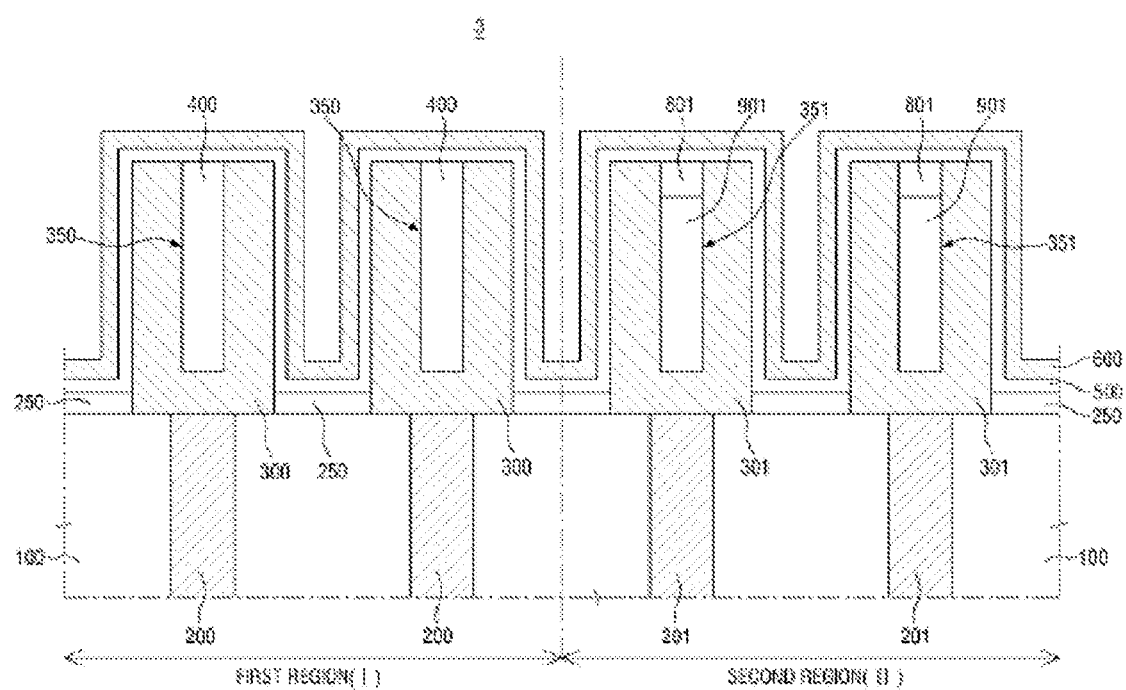
FIG. 7 is a cross-sectional view explaining a semiconductor device according to an example embodiment.

Referring to FIG. 7, a semiconductor device according to a third example embodiment will be described. FIG. 7 is a cross-sectional view explaining a semiconductor device according to another example embodiment.

Referring to FIG. 7, a substrate 1000 of a semiconductor device 3 according to another example embodiment includes a first region I and a second region II. The example semiconductor device 1 as described above may be formed in the first region I, and the example semiconductor device 2 as described above may be formed in the second region II.

Specifically, the semiconductor device 3 according to another example embodiment includes a second metal contact plug 201, a second lower electrode 301, a second trench 351, a third supporter 801, and a second void 901.

The substrate 1000 may be divided into the first region and the second region. The semiconductor device 1 may be formed in the first region I, and the semiconductor device 2 may be formed in the second region II.

The second metal contact plug 201 may be formed in the second region to penetrate the interlayer insulating layer 100. The second lower electrode 301 may be formed on the second metal contact plug 201. The second lower electrode 301 may include a first conductive material. For example, the first conductive material may be TiN, TaN, W, Ru, or Pt. The second trench 351 may be formed in the second lower electrode 301.

The third supporter 801 may be formed in the second trench 351. The third supporter 801 may not fill the second trench 351 as a whole, but may fill only a part of the second trench 351. The third supporter 801 may include a second conductive material that is different from the first conductive material that forms the second lower electrode 301. Specifically, the first conductive material may include a brittle material. By contrast, the second conductive material may include a ductile material. For example, the second conductive material may include $Ti_{0.5}W_{0.5}N$ or $Ti_{0.5}Mo_{0.5}N$. Further, the second conductive material may include a material having an ultimate tensile strength (UTS) that is higher than the UTS of the first conductive material. For example, the second conductive material may include carbon nanotube or graphene. The second void 901 may be formed in the second trench 351. The first void 900 may be formed on a lower portion of the third supporter 801. The second void 901 is an empty space in the second trench, and may mitigate the stress of the second lower electrode 301.

According to the semiconductor device 3 according to an example embodiment including two kinds of capacitors, if a capacitor in one region collapses or is damaged, and thus does not operate normally, a capacitor in another region can be used to increase redundancy. That is, the first lower electrode 300 in the first region I is advantageous in enduring the stress in the lateral direction, and the second lower electrode 301 in the second region II can prevent the lifting phenomenon. Accordingly, when the adjacent cells undergo the same or similar stress level, all the capacitors can be prevented from collapsing.

Then, referring to FIGS. 8 to 17, a method for fabricating a semiconductor device according to at least one example embodiment will be described.

Figure 8:
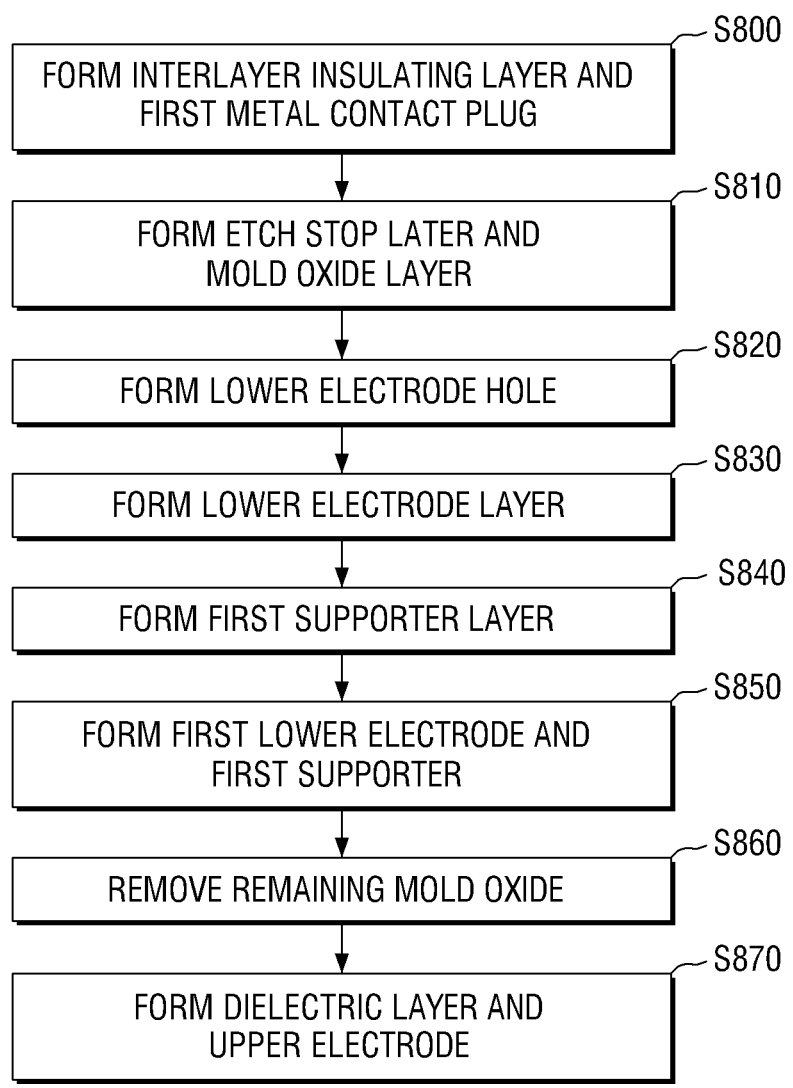
FIG. 8 is a flowchart explaining a method for fabricating a semiconductor device according to an example embodiment.

FIG. 8 is a flowchart explaining a method for fabricating a semiconductor device according to an example embodiment, and FIGS. 9 to 17 are views of intermediate steps explaining an example method for fabricating a semiconductor device.

Referring to FIG. 8, an interlayer insulating layer and a first metal contact plug are formed on a semiconductor substrate (S800).

Figure 9:
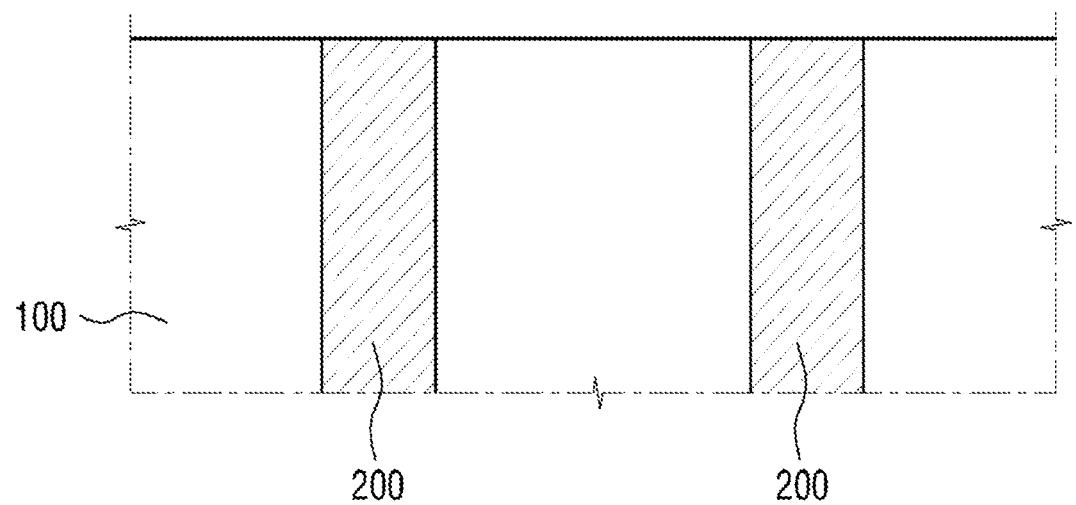
FIGS. 9 to 17 are views of intermediate steps explaining a method for fabricating a semiconductor device according an example embodiment.

Specifically, referring to FIG. 9, an interlayer insulating layer 100 is formed on a substrate 1000. Although not illustrated in FIG. 9, transistors and bit lines 1800 (in FIG. 1) may be positioned under the interlayer insulating layer 100. A first metal contact plug 200 may be formed to penetrate the interlayer insulating layer 100. Here, the first metal contact plug 200 may include a conduction material. Specifically, the first metal contact plug 200 may include, for example, at least one of poly silicon, metal silicide compound, conductive metal nitride, and metal, but is not limited thereto.

Referring again to FIG. 8, an etch stop layer and a mold oxide layer are formed (S810).

Figure 10:
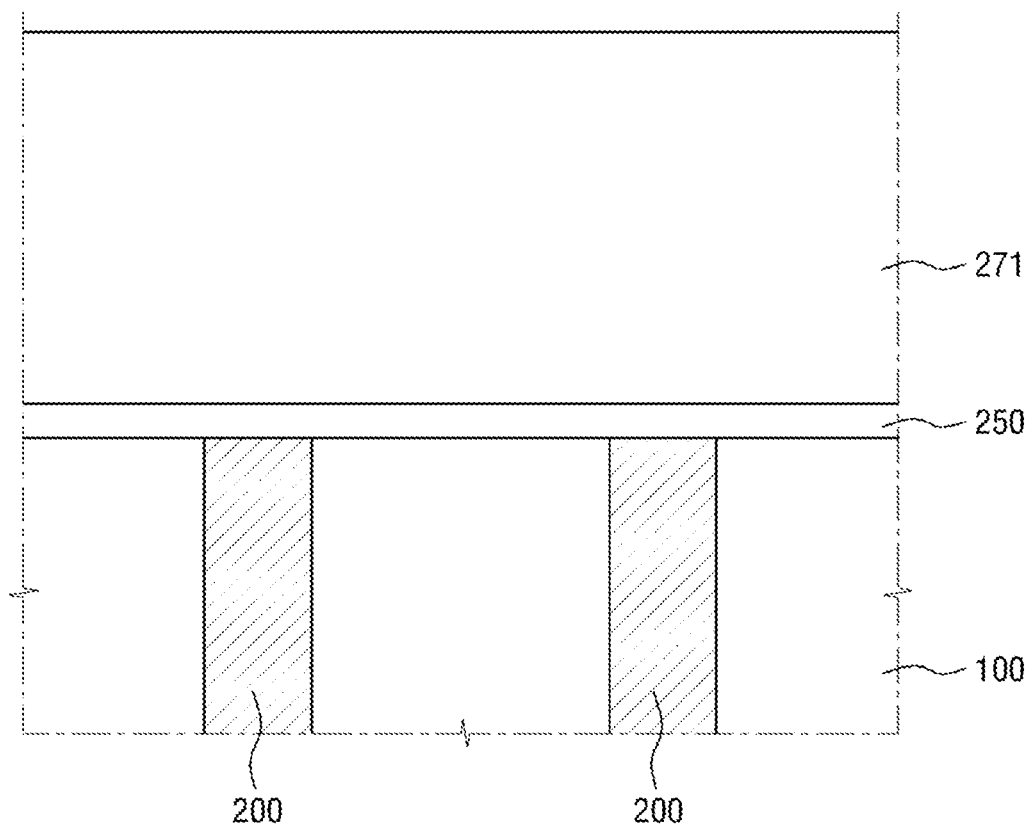
Figure 11:
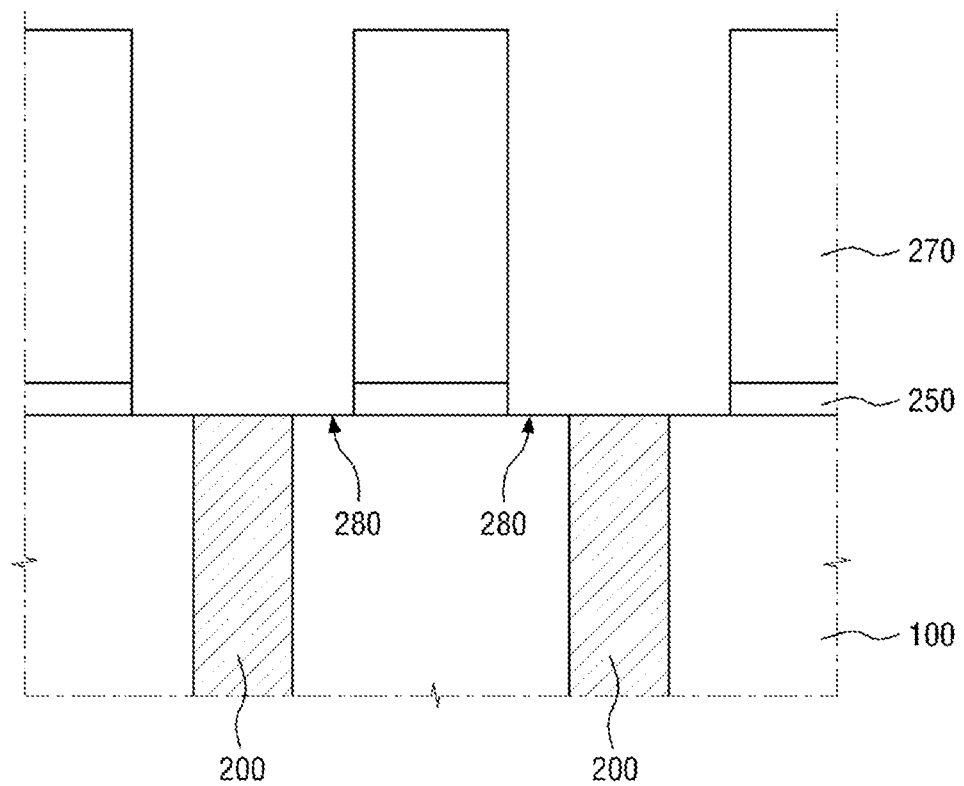

Specifically, referring to FIG. 10, the etch stop layer 250 is formed to cover the interlayer insulating layer 100 and the first metal contact plug 200. The etch stop layer 250 may be formed of a material having an inferior etch rate than the etch rate of the interlayer insulating layer 100, and may serve as an end point layer in an etching process. In this example embodiment, the etch stop layer 250 may include, for example, SiON or SiN. As needed, forming of the etch stop layer 250 may be omitted.

Next, the mold oxide layer 271 is formed on the etch stop layer 250. The mold oxide layer 271 may be patterned to provide a trench for forming a lower electrode. The mold oxide layer 271 is formed with a sufficient height so that the first lower electrode 300 can be sufficiently long.

Referring again to FIG. 8, a lower electrode hole is formed through etching of the mold oxide layer and the etch stop layer (S820).

Specifically, referring to FIG. 8, the mold oxide layer 271 and the etch stop layer 250 may be etched until an upper surface of the first metal contact plug 200 is exposed. The mold oxide layer 271 becomes mold oxide 270 after etching.

Accordingly, as illustrated, the lower electrode hole 280 is formed in the mold oxide 270.

Referring again to FIG. 8, a lower electrode layer is formed (S830).

Figure 12:
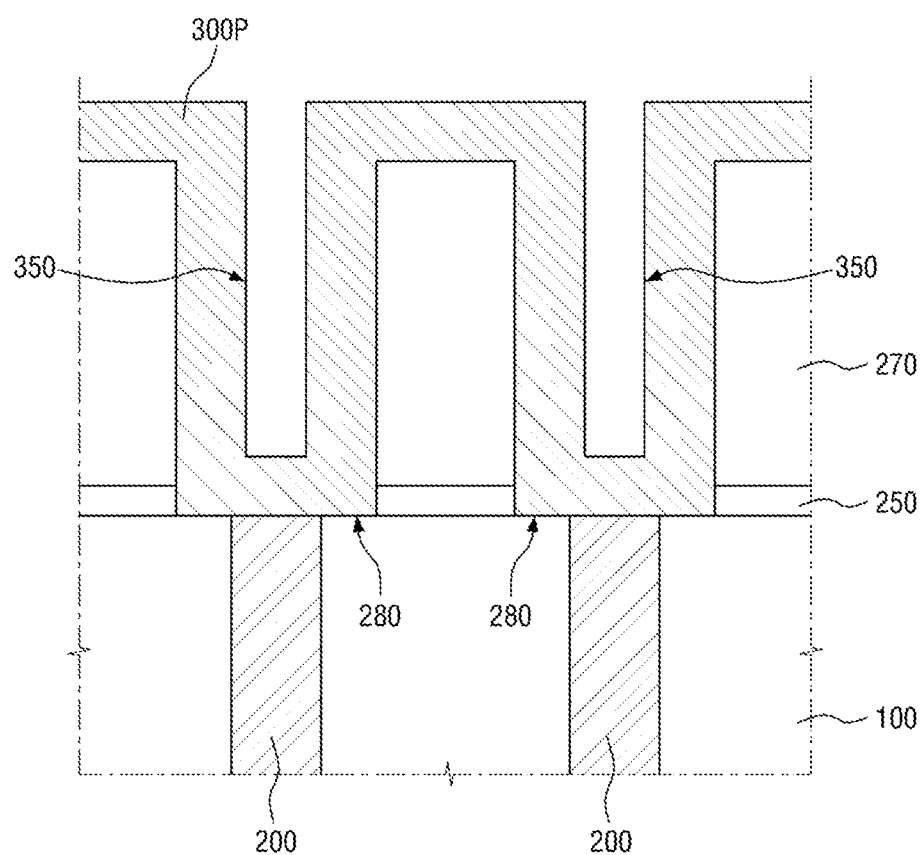

Specifically, referring to FIG. 12, the lower electrode layer 300p may be formed to cover upper surfaces of the lower electrode hole 280 and the mold oxide 270. As illustrated, the lower electrode layer 300p may be conformally formed along the shape of the mold oxide 270. The lower electrode layer 300p may be formed using chemical vapor deposition (CVD) or atomic layer deposition (ALD), but the example embodiment is not limited thereto.

Since the lower electrode layer 300p is conformally formed along the shape of the mold oxide 270, a first trench 350 may be formed on the lower electrode layer 300p as illustrated.

The lower electrode layer 300p may be made of a first conductive material. For example, the first conductive material may be TiN, TaN, W, Ru, or Pt, but is not limited thereto.

Referring again to FIG. 8, a first supporter layer is formed (S840).

Figure 13:
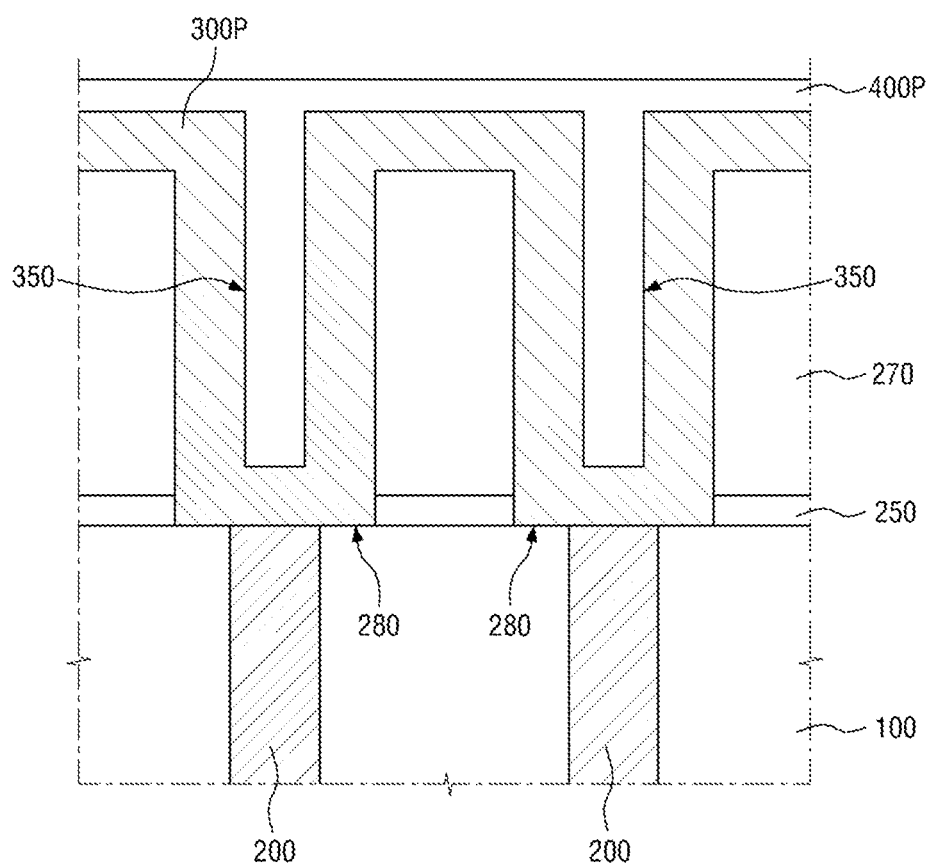

Specifically, referring to FIG. 13, the first supporter layer 400p is formed to substantially completely fill the first trench 350. Further, the first supporter layer 400p may also be formed to cover an upper surface of the lower electrode layer 300p.

The first supporter layer 400p may include a second conductive material that is different from the first conductive material that forms the lower electrode layer 300p. Specifically, since the first conductive material may be a brittle material, the second conductive material may include a ductile material. For example, the second conductive material may include $Ti_{0.5}W_{0.5}N$ or $Ti_{0.5}Mo_{0.5}N$.

Further, the second conductive material may include a material having an ultimate tensile strength (UTS) that is higher than the UTS of the first conductive material. For example, the second conductive material may include carbon nanotube or graphene.

Referring again to FIG. 8, a first lower electrode and a first supporter are formed (S850).

Figure 14:
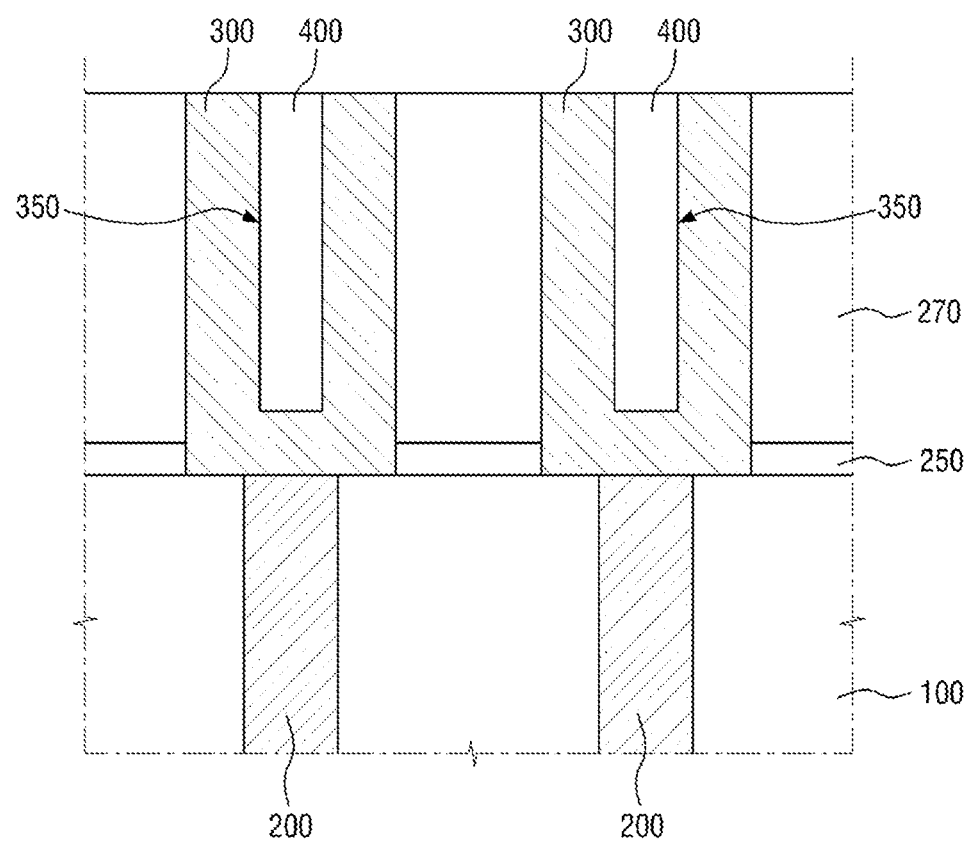

Specifically, referring to FIG. 14, the lower electrode layer 300p and the first supporter layer 400p may be etched until the upper surface of the mold oxide 270 is exposed. In accordance with the etching, node separation between cells is performed.

The lower electrode layer 300p and the first supporter layer 400p may be etched using a chemical mechanical polish (CMP) process. If the upper portion of the lower electrode layer 300p is etched, a first lower electrode 300 may be formed. If the upper portion of the first supporter layer 400p is etched, a first supporter 400 may be formed. An upper surface of the first supporter 400 may be on the same or a similar plane as the upper surface of the first lower electrode 300. The term "same plane" may include a fine step height between the upper surface of the first supporter 400 and the upper surface of the first lower electrode 300.

Referring to FIG. 8, the remaining mold oxide is removed (S860).

Figure 15:
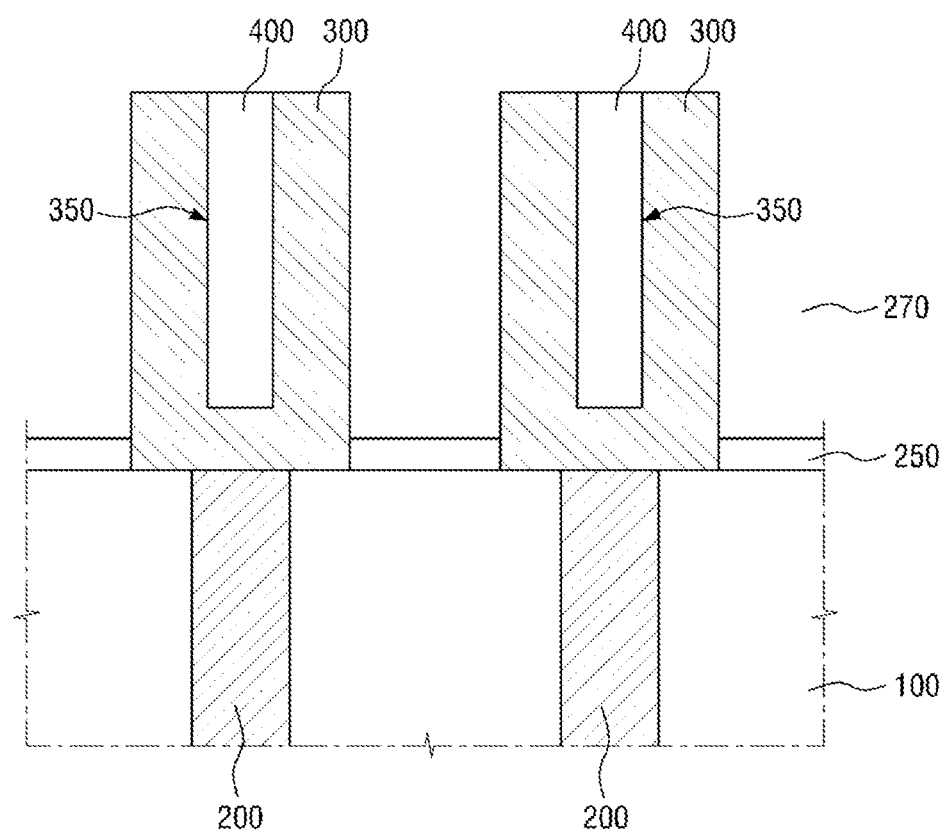

Specifically, referring to FIG. 15, the remaining mold oxide 270 is etched as a whole. Accordingly, only the etch stop layer 250 remains on a side surface of the first lower electrode 300, and thus an outer wall of the first lower electrode 300 is exposed. Accordingly, due to thermal and mechanical stresses, the first lower electrode 300 may collapse, or a part of the first lower electrode 300 may peel off. In this example embodiment, the first supporter 400 is formed in the semiconductor device 1, and thus the first lower electrode 300 is prevented from collapsing.

Referring to FIG. 8, a dielectric layer and an upper electrode are formed (S870).

Figure 16:
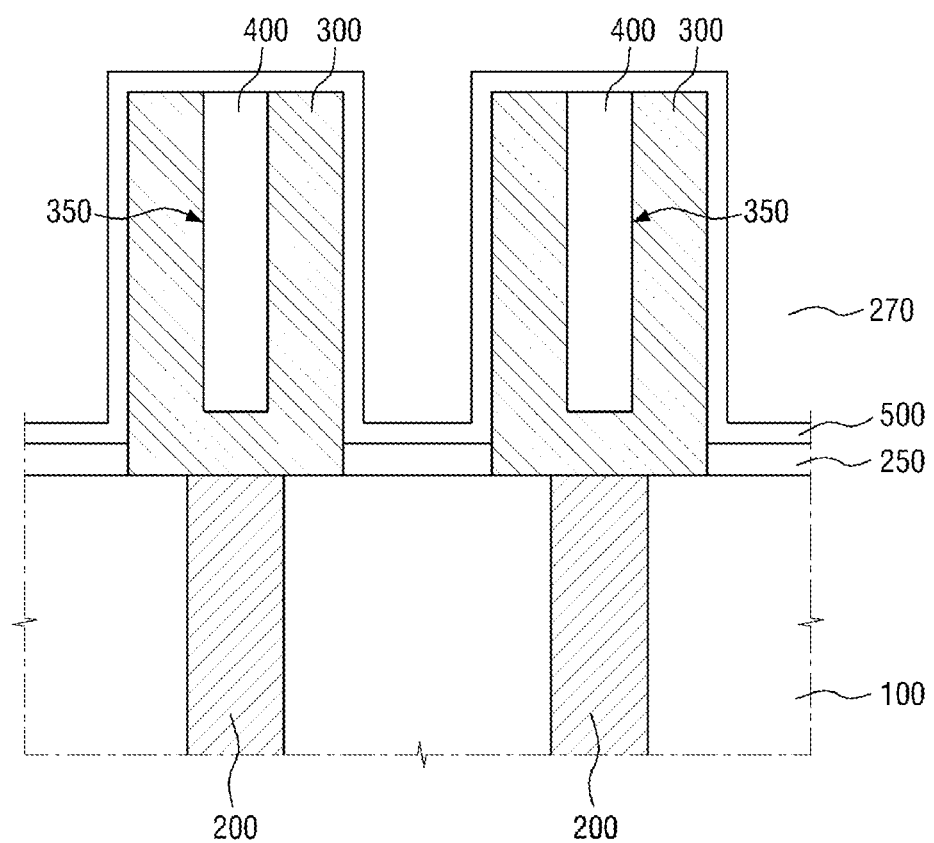

Specifically, referring to FIG. 16, the dielectric layer 500 may be formed to cover partially or substantially all of the etch stop layer 250, the first lower electrode 300, and the first supporter 400. The dielectric layer 500 may be formed of $Al_2O_3$, $HfO_2$, lanthanum oxide, $ZrO_2$, $Ta_2O_5$, $TiO_2$, $SrTiO_3$, $BaSrTiO_3$, or a combination thereof.

Figure 17:
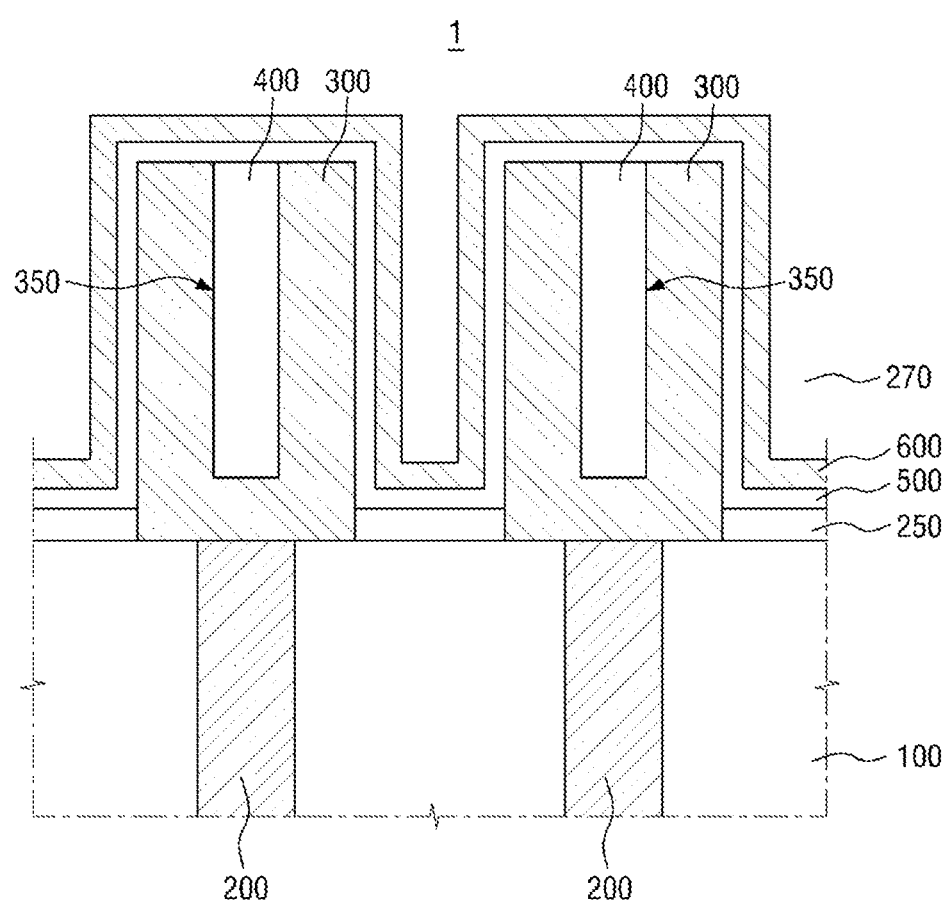

Then, referring to FIG. 17, an upper electrode 600 may be formed on the dielectric layer 500. The upper electrode 600 may include, for example, TiN, TaN, W, Ru, or Pt.

According to a capacitor using the stack type lower electrode, in its fabricating process, the lower electrode is unable to be supported and collapses, and due to this, device isolation is not performed to lower the reliability of the semiconductor device. According to this example embodiment, the first supporter 400 is formed through putting of the second conductive material that is different from the first conductive material forming the first lower electrode 300 in the first trench 350 formed inside the stack type first lower electrode 300, and thus even when the mold oxide 270 is removed, the lower electrode does not collapse in the semiconductor device 1.

Specifically, the first supporter 400 may include a ductile material to at least partially offset the first conductive brittle material that forms the first lower electrode 300, and thus the first lower electrode 300 can be prevented from being broken and/or bent.

Further, since the second conductive material includes a material having a high UTS such as, for example, carbon nanotube or graphene, the first lower electrode 300 can endure the external stress.

The first lower electrode 300, the dielectric layer 500, and the upper electrode 600 may form a capacitor in a storage device. In this example embodiment, the capacitor may be a storage device of the DRAM, but is not limited thereto. That is, the capacitor may be used to fabricate a general capacitor.

Then, referring to FIGS. 18 to 25, a method for fabricating a semiconductor device according to an example embodiment will be described. Since this example embodiment presents similarities with the fabricating method according to the example embodiment described above, except for a sacrificial layer and a first void, explanation of the duplicate portions to the fabricating method according to the example embodiment described above will be simplified or omitted.

Figure 18:
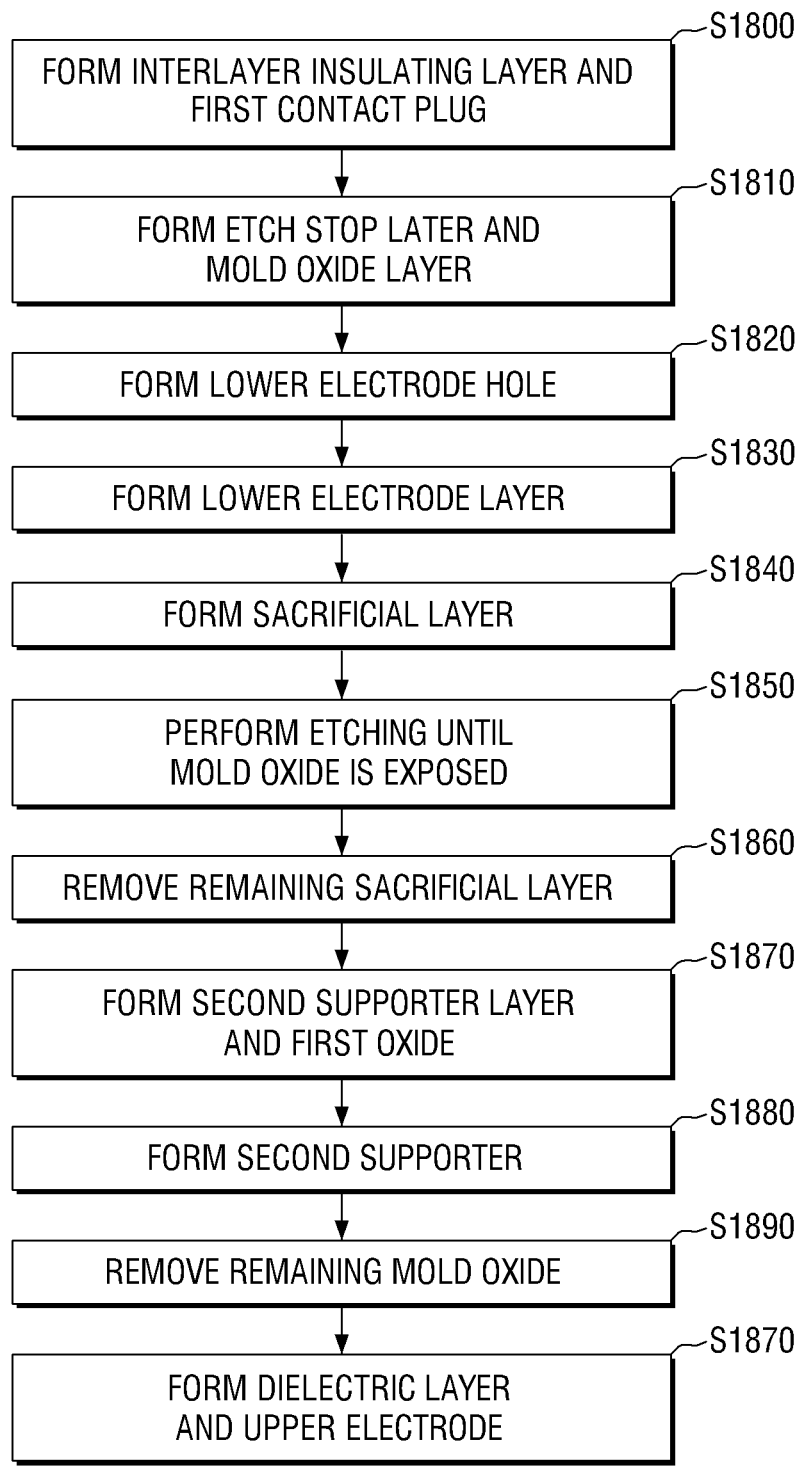
FIG. 18 is a flowchart explaining a method for fabricating a semiconductor device according to an example embodiment.

FIG. 18 is a flowchart explaining a method for fabricating a semiconductor device according to an example embodiment, and FIGS. 19 to 25 are views of intermediate steps explaining the example method for fabricating a semiconductor device.

Referring to FIG. 18, an interlayer insulating layer and a first metal contact plug are formed on a semiconductor substrate (S1800). An etch stop layer and a mold oxide layer may be subsequently formed (S1810). Then, a lower electrode hole is formed through etching of the mold oxide layer and the etch stop layer (S1820). Then, a lower electrode layer is formed (S1830). The above-described processes are similar to those of the example embodiment described above.

Referring to FIG. 18, a sacrificial layer is formed (S1840).

Figure 19:
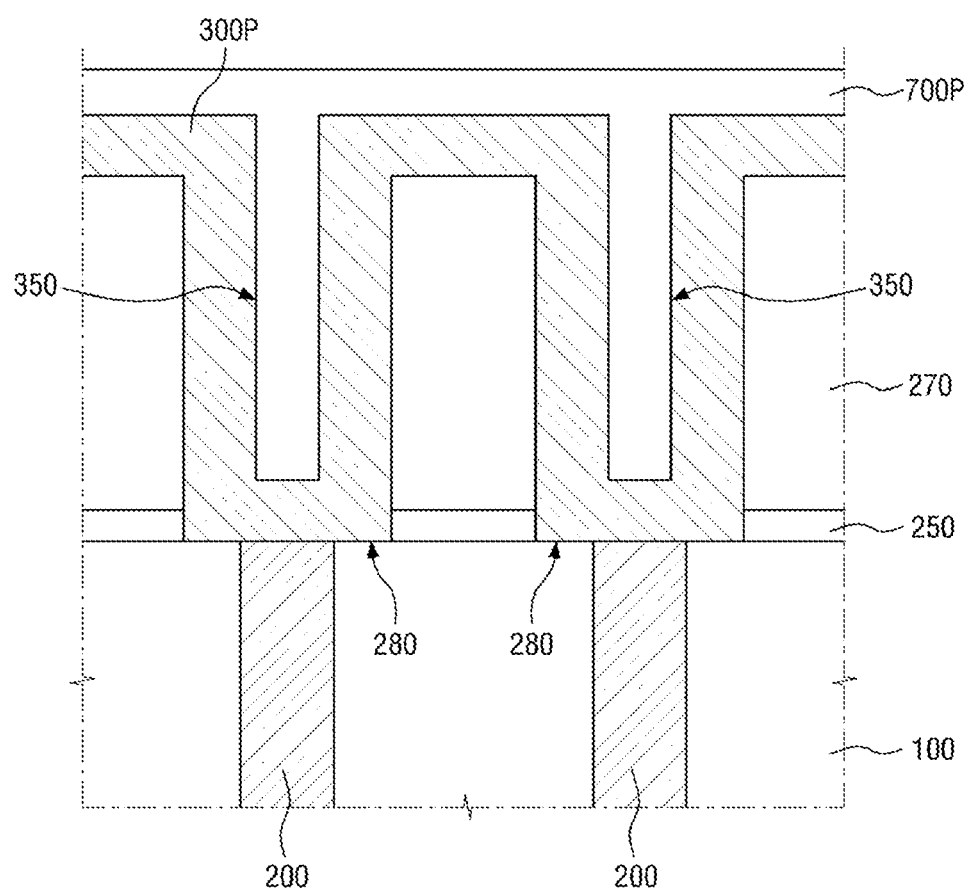
FIGS. 19 to 25 are views of intermediate steps explaining a method for fabricating a semiconductor device according to an example embodiment.

Specifically, referring to FIG. 19, the sacrificial layer 700p may be formed to substantially completely fill a first trench 350. Further, the sacrificial layer 700p may be formed to cover an upper surface of a lower electrode layer 300p. The sacrificial layer 700p may be formed to remove dust or foreign substances existing in the first trench 350. The sacrificial layer 700p is removed later, and in this case, the dust or foreign substances existing in the first trench 350 can be also removed. The sacrificial layer 700p may include photoresist, carbon, or oxide.

Referring to FIG. 18, etching is performed until the mold oxide is exposed (S1850).

Figure 20:
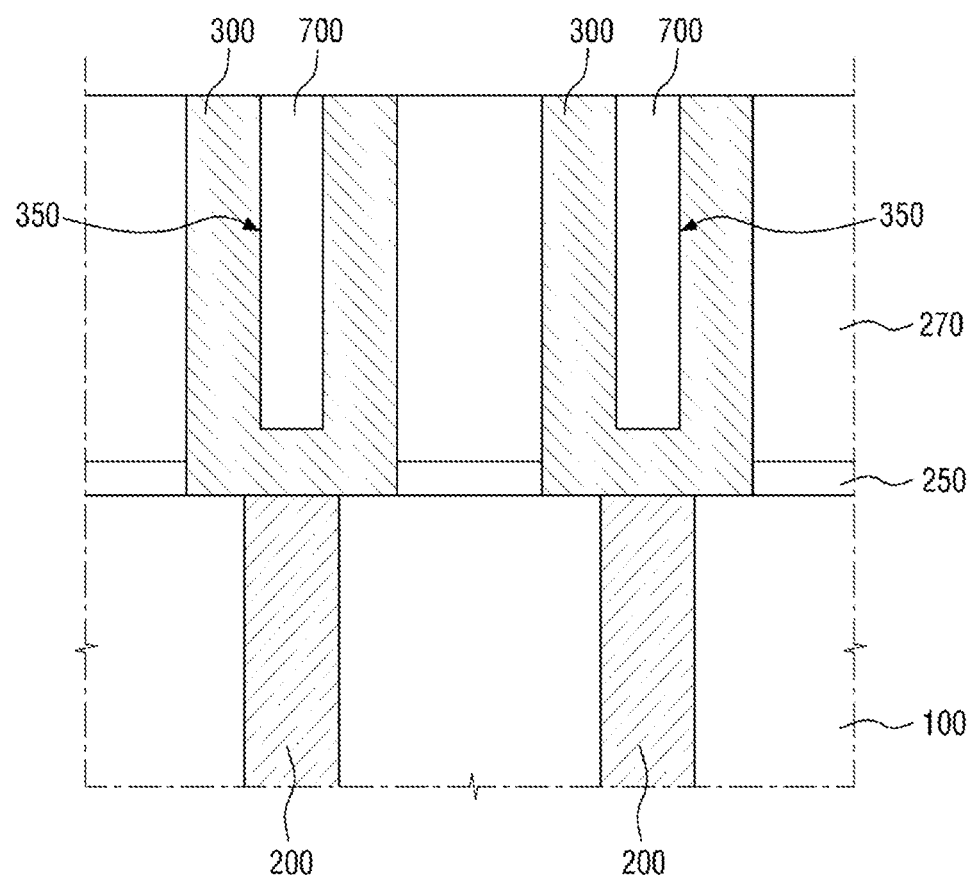

Specifically, referring to FIG. 20, the lower electrode layer 300p and the sacrificial layer 700p may be etched until an upper surface of the mold oxide 270 is exposed. The lower electrode layer 300p and the sacrificial layer 700p may be etched using a CMP process. A first lower electrode 300 may be formed through etching of the lower electrode layer 300p. One part of the sacrificial layer 700p is etched, and the other part of the sacrificial layer 700p is not etched. An upper surface of the remaining sacrificial layer 700 may be on the same or a similar plane as an upper surface of the first lower electrode 300. The "same plane" may include a fine step height formed between the upper surface of the remaining sacrificial layer 700 and the upper surface of the second lower electrode 301.

Referring to FIG. 18, the remaining sacrificial layer is removed (S1860).

Figure 21:
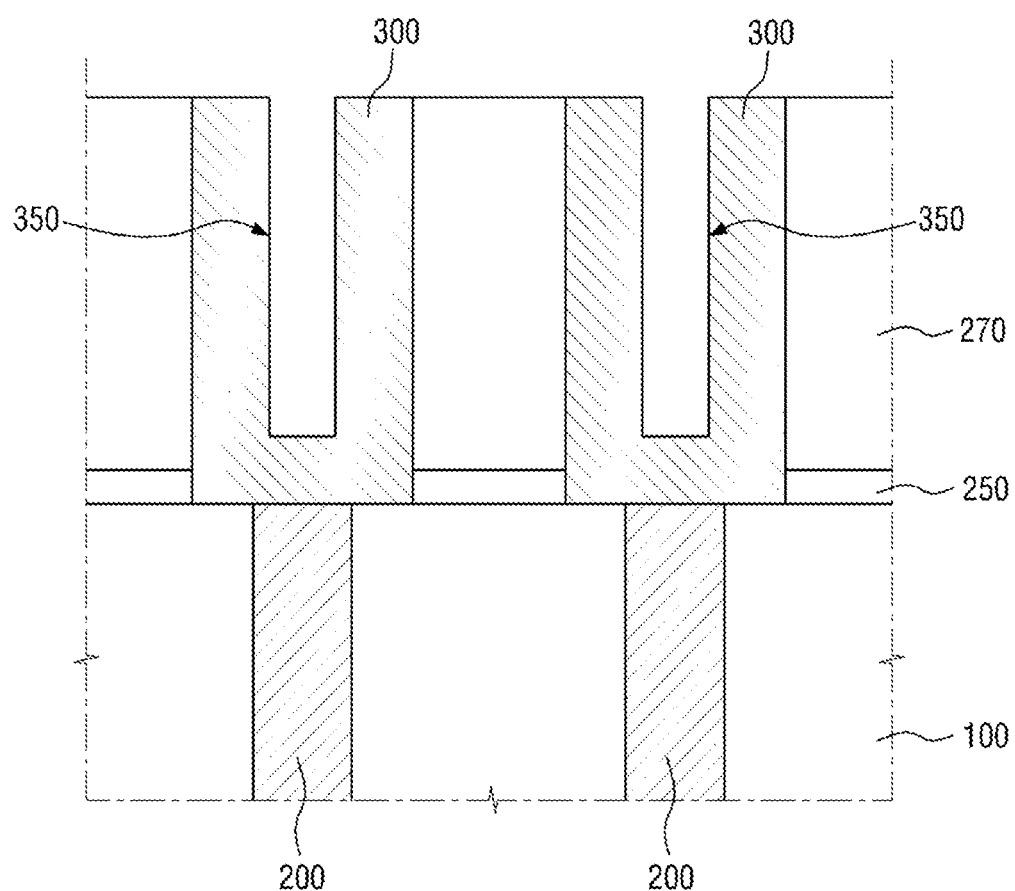

Specifically, referring to FIG. 21, partially or substantially all of the remaining sacrificial layer 700 can be removed. A method for removing the remaining sacrificial layer 700 may include ashing or an ozone ($O_3$) process. Through this process, the remaining sacrificial layer 700 may be substantially entirely removed. Accordingly, the dust and foreign substances existing in the first trench 350 can be removed.

Referring to FIG. 18, a second supporter layer and a first void are formed (S1870).

Figure 22:
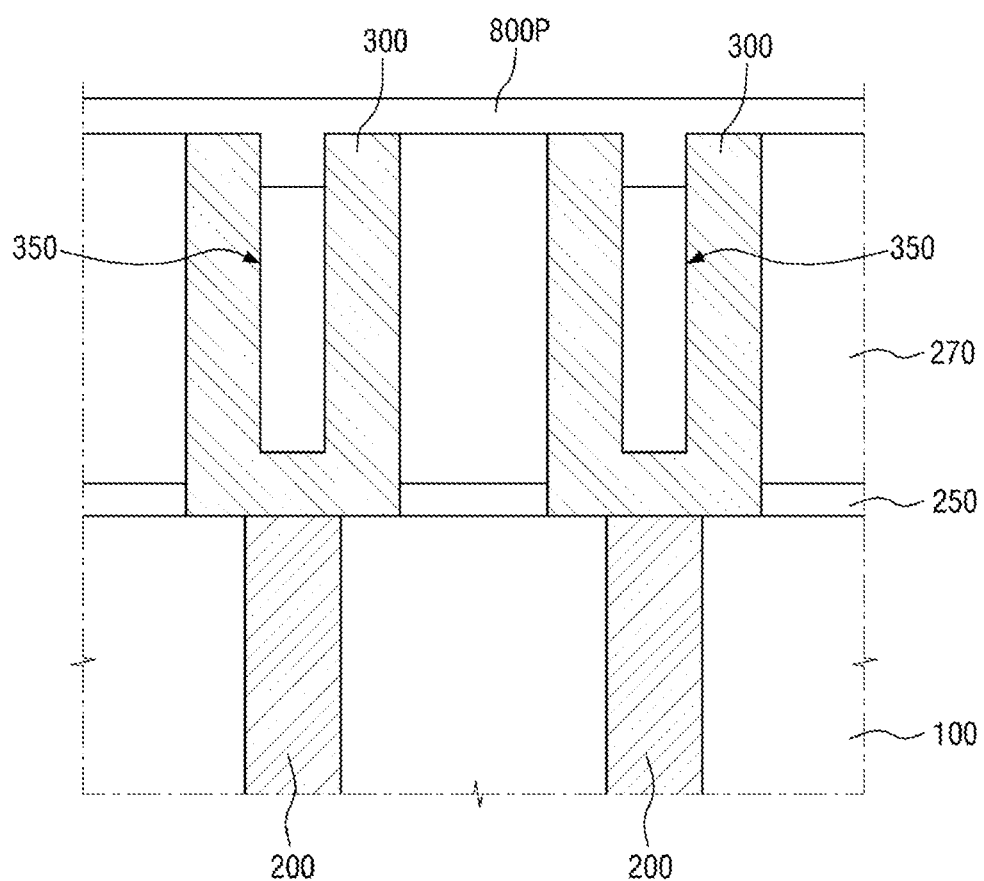

Specifically, referring to FIG. 22, the second support layer 800p may be formed on upper portions of the mold oxide 270, the first lower electrode 300, and the first trench 350. A method with inferior step coverage, having a higher probability of forming air gaps, may be used to form the second supporter layer 800p. In this example embodiment, for example, PVD may be used in such a method, but the present inventive concept is not limited thereto.

As the second supporter layer 800p is formed, as illustrated, the first void may be simultaneously formed. The second supporter layer 800p may include a second conductive material that is different from the first conductive material that forms the first lower electrode 300. Specifically, the first conductive material that forms the first lower electrode 300 may include a brittle material. A second supporter 800 may include a ductile material to at least partially offset the first conductive material. For example, the second conductive material may include $Ti_{0.5}W_{0.5}N$ or $Ti_{0.5}Mo_{0.5}N$.

Further, the second conductive material may include a material having an ultimate tensile strength (UTS) that is higher than the UTS of the first conductive material. For example, the second conductive material may include carbon nanotube or graphene.

The first void 900 is an empty space in the first trench 350, and may mitigate the stress of the first lower electrode 300 to prevent a lifting phenomenon.

Referring to FIG. 18, a second supporter is formed (S1880).

Figure 23:
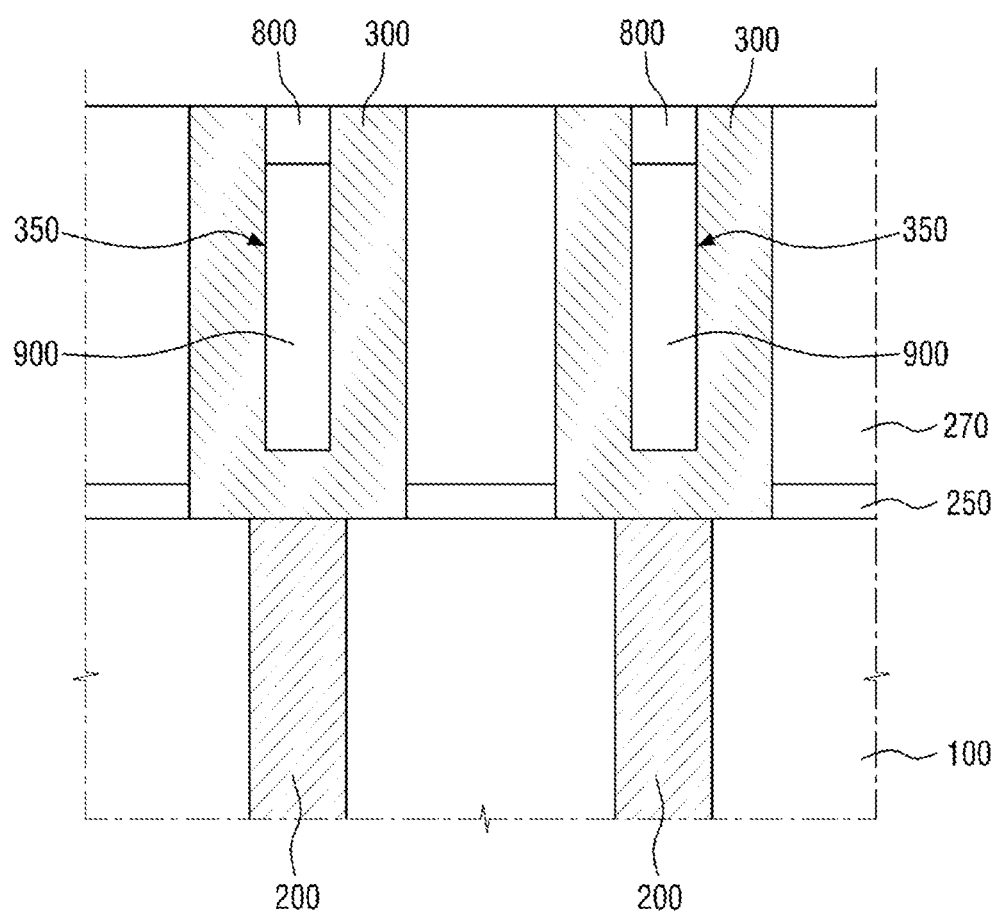

Specifically, referring to FIG. 23, the second supporter layer 800p may be etched until the upper surface of the mold oxide 270 is exposed. In accordance with the etching, node separation between cells is performed. The first supporter layer 400p may be etched using, for example, a CMP process. A second supporter 800 is formed through etching of the second supporter layer 800p. An upper surface of the second supporter 800 may be on the same or a similar plane as the upper surface of the first lower electrode 300. The expression "same plane" may include a fine step height between the upper surface of the second supporter 800 and the upper surface of the first lower electrode 300.

Referring to FIG. 18, the remaining mold oxide is removed (S1890).

Figure 24:
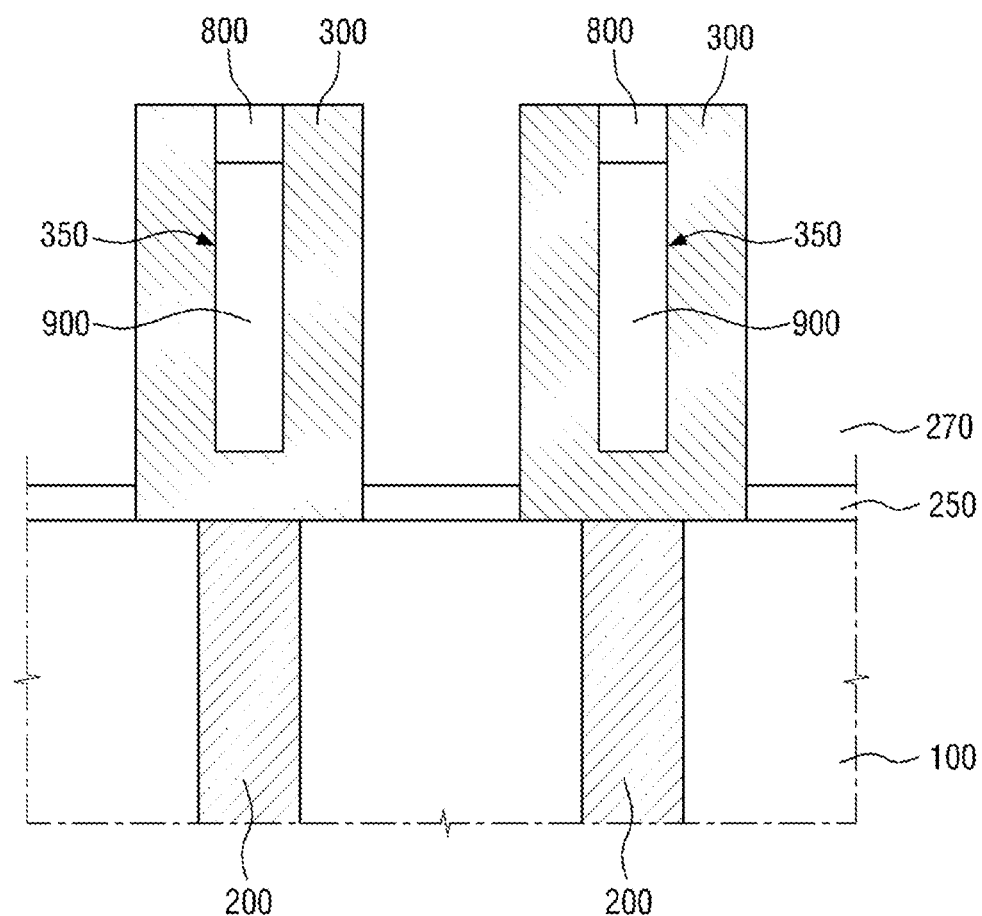

Specifically, referring to FIG. 24, the remaining mold oxide 270 is partially or substantially entirely etched. Accordingly, an outer wall of the first lower electrode 300 is exposed, and thus the first lower electrode 300 may collapse. According to the semiconductor device 2 according to an example embodiment, the first lower electrode 300 is prevented from collapsing by the second supporter 800 and the first void 900.

Figure 25:
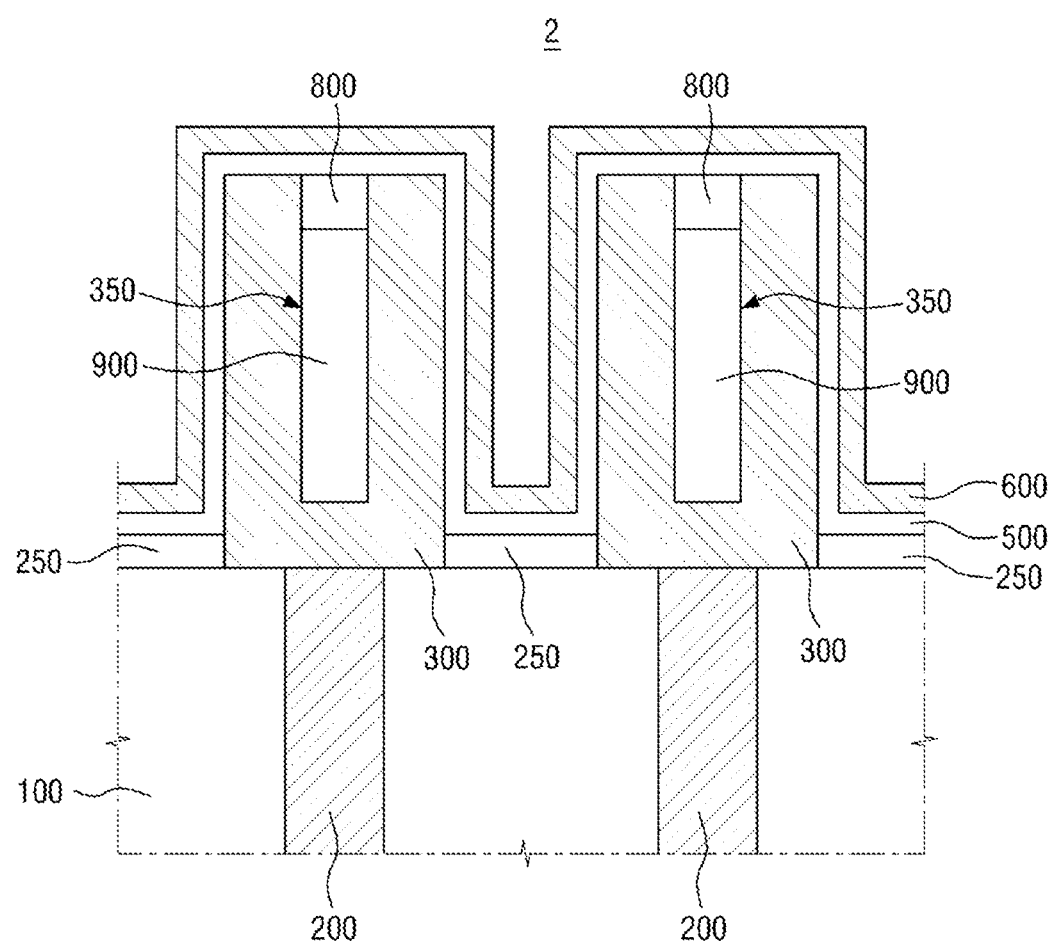

Referring to FIG. 25, a dielectric layer 500 may be formed to cover substantially all the etch stop layer 250, the first lower electrode 300, and the second supporter 800. The dielectric layer 500 may include, for example, $Al_2O_3$, $HfO_2$, lanthanum oxide, $ZrO_2$, $Ta_2O_5$, $TiO_2$, $SrTiO_3$, $BaSrTiO_3$, or a combination thereof. An upper electrode 600 may be formed on the dielectric layer 500. The upper electrode 600 may include, for example, TiN, TaN, W, Ru, or Pt. The first lower electrode 300, the dielectric layer 500, and the upper electrode 600 may form a capacitor to serve as a storage device.

Figure 26:
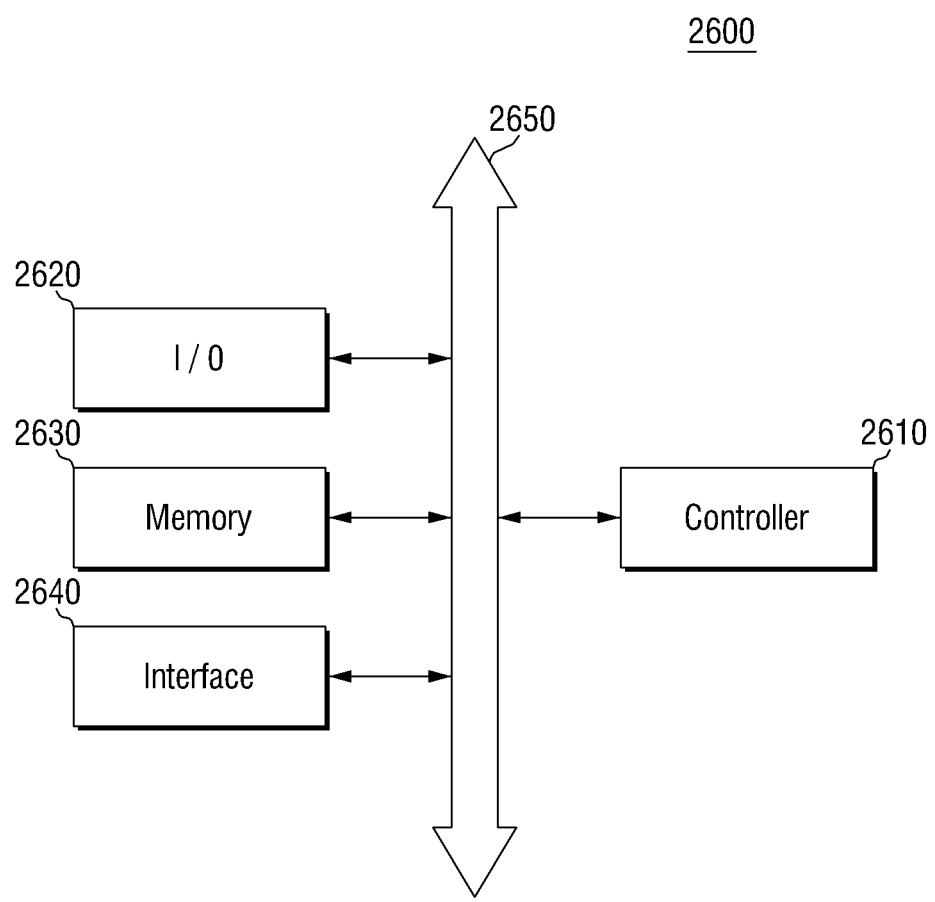
FIG. 26 is a block diagram illustrating an example of an electronic system including a semiconductor device fabricated according to an example method for fabricating a semiconductor device.

FIG. 26 is an exemplary block diagram of an electronic system including a semiconductor device according to some embodiments of the present inventive concept.

Referring to FIG. 26, an electronic system 2600 may include a controller 2610, an input/output (I/O) device 2620, a memory 2630, an interface 2640, and a bus 2650. The controller 2610, the I/O device 2620, the memory 2630 and/or the interface 2640 may be connected to each other through the bus 2650. The bus 2650 corresponds to paths through which data is transferred.

The controller 2610 may include at least one of a microprocessor, a digital signal processor, a microcontroller, and logic elements that can perform similar functions. The I/O device 2620 may include a keypad, a keyboard, and a display device. The memory 2630 may store data and/or commands. The memory 2630 may include the semiconductor device according to some embodiments of the present inventive concept. The memory 2630 may include a DRAM. The interface 2640 may function to transfer the data to a communication network or receive the data from the communication network. The interface 2640 may be of a wired or wireless type. For example, the interface 2640 may include an antenna or a wire/wireless transceiver.

The electronic system 2600 may be applied to a PDA (Personal Digital Assistant), a portable computer, a web tablet, a wireless phone, a mobile phone, a digital music player, a memory card, or all electronic devices that can transmit and/or receive information in wireless environments.

Figure 27:
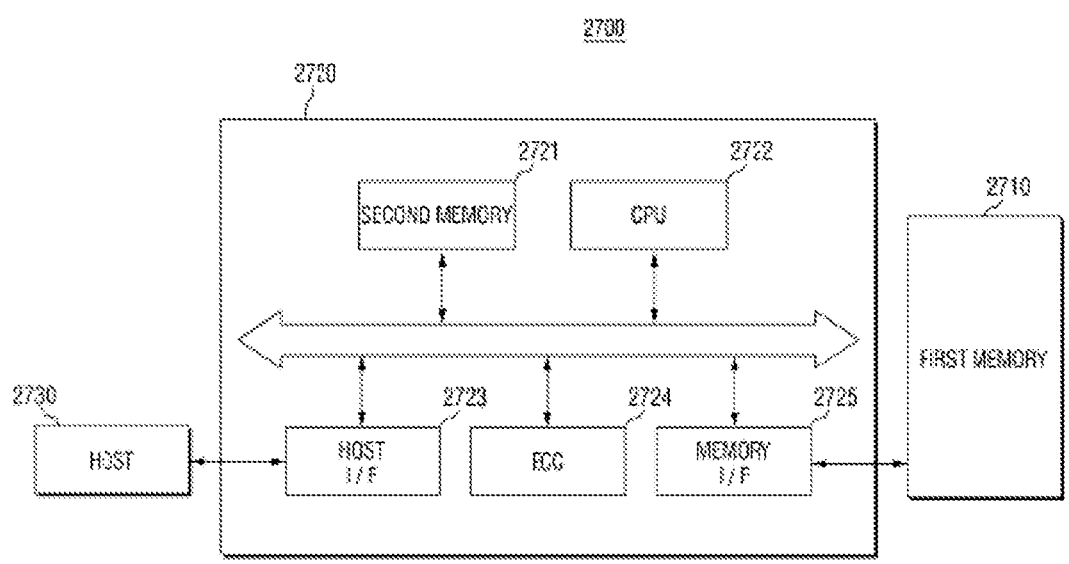
FIG. 27 is a block diagram illustrating an example of a memory card including a semiconductor device fabricated according to an example method for fabricating a semiconductor device.

FIG. 27 is a block diagram illustrating an example of a memory card that includes a semiconductor device fabricated according to the method for fabricating a semiconductor device according to example embodiments.

Referring to FIG. 27, a first memory 2710 that includes a semiconductor device fabricated according to various example embodiments may be adopted in a memory card 2700. The memory card 2700 may include a memory controller 2720 that controls date exchange between a host 2730 and the first memory 2710.

A second memory 2721 may be used as a cache memory of a central processing unit 2722. The second memory 2721 may include a semiconductor device according to some example embodiments. A host interface 2723 may include a protocol for the host 2730 to access the memory card 2700 to perform date exchange. An error correction code 2724 may detect and correct errors of data read from the first memory 2710. A memory interface 2725 may interface with the first memory 2710. The central processing unit 2722 may perform overall control operation related to data exchange with the memory controller 2720.

Figure 28:
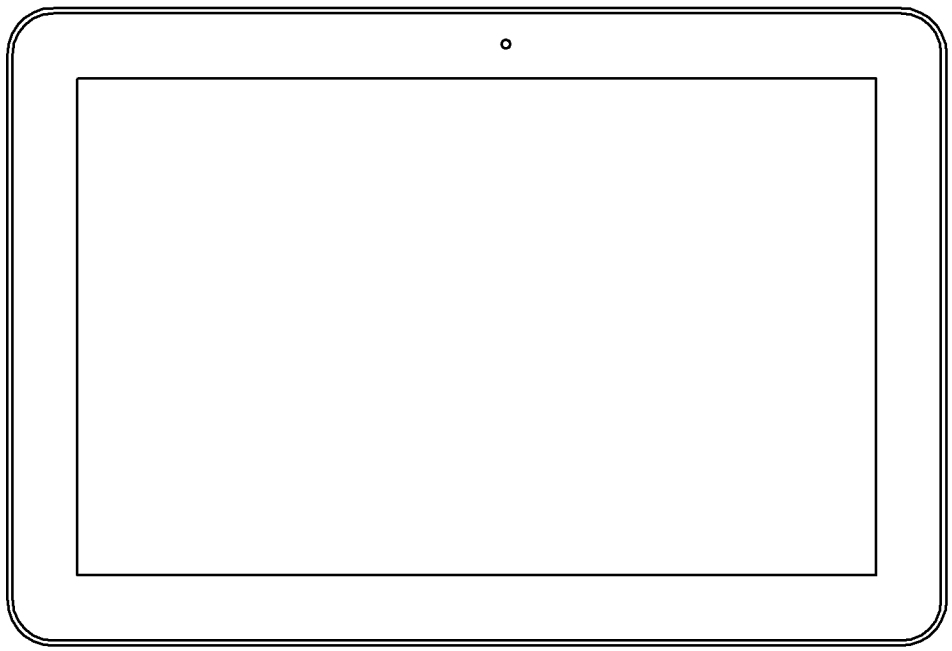
FIGS. 28 and 29 are views of an exemplary semiconductor system to which a semiconductor device according to example embodiments can be applied.
Figure 29:
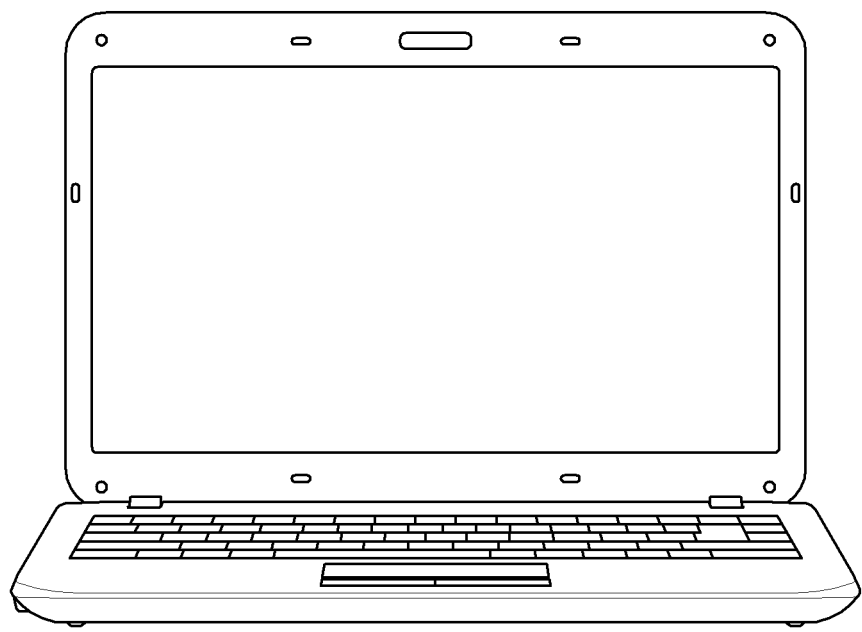

FIGS. 28 and 29 are views of example semiconductor systems to which the semiconductor device according to example embodiments of the present inventive concept can be applied. FIG. 28 illustrates a tablet PC, and FIG. 29 illustrates a notebook computer. It is apparent to those of skilled in the art that the semiconductor device according to example embodiments can be applied even to other integrated circuit devices that have not been exemplified.

While the present inventive concept has been particularly shown and described with reference to example embodiments thereof, it will be understood by those of ordinary skill in the art that various changes in form and details may be made therein without departing from the spirit and scope of the present inventive concept as defined by the following claims. It is therefore desired that the example embodiments be considered in all respects as illustrative and not restrictive, reference being made to the appended claims rather than the foregoing description to indicate the scope of the invention.

What is claimed is:

1. A semiconductor device comprising:
an interlayer insulating layer on a semiconductor substrate;
a metal contact plug in at least a portion of the interlayer insulating layer;
a cylindrical lower electrode on the metal contact plug and including a first metal and a trench;
a supporter in the trench and including a second metal that is different from the first metal;
a dielectric layer on the lower electrode and directly on the supporter; and
an upper electrode on the dielectric layer;
wherein the second metal has an ultimate tensile strength (UTS) that is higher than a UTS of the first metal.

2. The semiconductor device of claim 1, wherein the trench is substantially entirely filled by the supporter.

3. The semiconductor device of claim 1, wherein
the first metal includes TiN; and
the second metal includes carbon nanotube or graphene.

4. The semiconductor device of claim 1, wherein the trench comprises a void.

5. The semiconductor device of claim 1, wherein the semiconductor substrate includes a first region and a second region,
the metal contact plug includes a first metal contact plug in the first region and a second metal contact plug in the second region,
the lower electrode includes a first lower electrode on the first metal contact plug and having a first trench, and a second lower electrode on the second metal contact plug and having a second trench, and
the supporter includes a first supporter substantially completely filling the first trench and a second supporter at least partially filling the second trench.

6. The semiconductor device of claim 5, wherein the second trench comprises a void.

7. The semiconductor device of claim 1, wherein an upper surface of the first lower electrode and an upper surface of the supporter are substantially coplanar.

8. The semiconductor device of claim 1, further comprising a transistor and a bit line electrically connected to the metal contact plug under the interlayer insulating layer.

9. The semiconductor device of claim 8, wherein the transistor includes a BCAT (Buried Channel Array Transistor).

10. A semiconductor device comprising:

an interlayer insulating layer on a semiconductor substrate;

a metal contact plug in at least a portion of the interlayer insulating layer;

a cylindrical lower electrode on the metal contact plug and including a first conductive material and a trench;

a supporter in the trench and including a second conductive material that is different from the first conductive material;

a dielectric layer on the lower electrode and directly on the supporter; and an upper electrode on the dielectric layer, wherein a first value of the first conductive material, obtained by dividing a shear modulus by an elastic bulk modulus, is equal to or larger than 0.57, and a second value of the second conductive material, obtained by dividing the shear modulus by the elastic bulk modulus, is equal to or smaller than 0.57, and wherein the second conductive material includes $Ti_{0.5}W_{0.5}N$ or $Ti_{0.5}Mo_{0.5}N$.

11. The semiconductor device of claim 10, wherein at least one of the first conductive material and the second conductive material include metal nitride.

12. The semiconductor device of claim 11, wherein the first conductive material includes TiN.

13. A semiconductor device comprising:

an interlayer insulating layer on a semiconductor substrate;

a metal contact plug in at least a portion of the interlayer insulating layer;

a lower electrode on the metal contact plug, the lower electrode including a trench;

a supporter in the trench, the supporter being more ductile than the lower electrode; and a dielectric layer on the lower electrode and directly on the supporter, wherein the trench is substantially entirely filled by the supporter.

14. The semiconductor device of claim 13, further comprising an upper electrode on the dielectric layer.

15. The semiconductor of claim 14, wherein the lower electrode and the upper electrode form a capacitor.

16. The semiconductor device of claim 13, wherein:

a first value obtained by dividing a shear modulus of the lower electrode by an elastic bulk modulus of the lower electrode is in a brittle range, and a second value obtained by dividing a shear modulus of the supporter by an elastic bulk modulus of the supporter is in a ductile range.

17. The semiconductor device of claim 13, wherein the lower electrode is more brittle than the supporter.

* * * * *